US012581840B2

(12) United States Patent　　　(10) Patent No.:　US 12,581,840 B2
Lee　　　　　　　　　　　　　　　　　(45) Date of Patent:　　Mar. 17, 2026

(54) DISPLAY DEVICE INCLUDING LOW REFRACTIVE AND ANTI-REFLECTION LAYERS

(71) Applicant: Samsung Display Co., Ltd., Yongin-si (KR)

(72) Inventor: Eonjoo Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 363 days.

(21) Appl. No.: 18/119,534

(22) Filed: Mar. 9, 2023

(65) Prior Publication Data

US 2023/0403913 A1　　Dec. 14, 2023

(30) Foreign Application Priority Data

Jun. 14, 2022　(KR) ........................ 10-2022-0071854

(51) Int. Cl.
　H10K 59/80　　　(2023.01)
　H10K 59/122　　(2023.01)
　H10K 59/40　　　(2023.01)
　H10K 50/842　　　(2023.01)
　H10K 59/12　　　(2023.01)

(52) U.S. Cl.
　CPC ......... H10K 59/879 (2023.02); H10K 59/122 (2023.02); H10K 59/40 (2023.02); H10K 59/873 (2023.02); H10K 59/8792 (2023.02); H10K 50/8426 (2023.02); H10K 59/12 (2023.02)

(58) Field of Classification Search
　CPC .... H10K 59/879; H10K 59/122; H10K 59/40; H10K 59/873; H10K 59/8792; H10K 59/38; H10K 59/352; H10K 59/8791; H10K 59/12; H10K 50/865; H10K 50/844; H10K 50/858; H10K 50/8426
See application file for complete search history.

(56) References Cited

U.S. PATENT DOCUMENTS

| | | |
|---|---|---|
| 9,692,018 B2 | 6/2017 | Cho et al. |
| 10,510,810 B2 | 12/2019 | Kim et al. |
| 10,553,827 B2 | 2/2020 | Jang et al. |
| 10,916,592 B2 | 2/2021 | Lee et al. |
| 11,081,676 B2 | 8/2021 | Kim et al. |
| 11,574,962 B2 | 2/2023 | Ha et al. |
| 2006/0165964 A1 | 7/2006 | Kato |

(Continued)

FOREIGN PATENT DOCUMENTS

| | | |
|---|---|---|
| KR | 1020050106496 A | 11/2005 |
| KR | 1020160031108 A | 3/2016 |

(Continued)

*Primary Examiner* — Ida M Soward
(74) *Attorney, Agent, or Firm* — CANTOR COLBURN LLP

(57)　　　　　　ABSTRACT

A display device includes: a display panel, a pattern layer, and a low refractive layer having a refractive index lower than a refractive index of the pattern layer. The display panel includes: a base layer; a pixel definition layer disposed on the base layer, where a pixel opening is defined in the pixel definition layer; an emission layer disposed in the pixel opening; an anti-reflection layer disposed on the emission layer; and an encapsulation layer disposed on the anti-reflection layer. The pattern layer, the low refractive layer, or the encapsulation layer includes at least one of pigment or dye.

21 Claims, 23 Drawing Sheets

(56)                References Cited

U.S. PATENT DOCUMENTS

| | | | | |
|---|---|---|---|---|
| 2017/0279084 | A1* | 9/2017 | Sakamoto | H10K 59/878 |
| 2020/0161579 | A1* | 5/2020 | Kim | H10K 59/126 |
| 2020/0321400 | A1* | 10/2020 | Park | H10K 59/8792 |
| 2020/0365833 | A1* | 11/2020 | Joo | H10K 59/8731 |
| 2021/0005845 | A1* | 1/2021 | Kim | G06F 3/0412 |
| 2021/0005846 | A1 | 1/2021 | Kim et al. | |
| 2021/0202917 | A1 | 7/2021 | Lee et al. | |
| 2021/0273022 | A1* | 9/2021 | Park | G02B 5/26 |
| 2021/0399068 | A1* | 12/2021 | Kim | H10K 59/8792 |
| 2021/0399262 | A1* | 12/2021 | Woo | H10K 59/40 |
| 2021/0408135 | A1* | 12/2021 | Kwon | H10K 71/00 |
| 2022/0005874 | A1* | 1/2022 | Oh | H10K 50/844 |
| 2022/0123072 | A1* | 4/2022 | Kim | H05K 3/321 |
| 2022/0140283 | A1* | 5/2022 | Kim | H10K 59/38 |
| | | | | 257/40 |
| 2022/0199690 | A1* | 6/2022 | Lee | H10K 59/38 |
| 2022/0285465 | A1* | 9/2022 | Kang | H10K 59/122 |
| 2022/0285475 | A1* | 9/2022 | Hong | H10K 59/122 |
| 2022/0298279 | A1* | 9/2022 | Yun | C08F 222/102 |
| 2022/0302405 | A1* | 9/2022 | Choi | H10K 59/38 |
| 2022/0310976 | A1* | 9/2022 | Lee | H10K 59/877 |
| 2022/0320467 | A1* | 10/2022 | Ye | H10K 50/171 |
| 2022/0352432 | A1* | 11/2022 | Cho | H10H 20/8514 |
| 2022/0367772 | A1* | 11/2022 | Oh | H10H 20/01 |
| 2022/0392961 | A1* | 12/2022 | Kim | H10K 59/38 |
| 2022/0406877 | A1* | 12/2022 | Cha | H10K 59/121 |
| 2023/0009629 | A1* | 1/2023 | Lee | H01L 25/0753 |
| 2023/0014374 | A1* | 1/2023 | Lee | H01L 25/0753 |
| 2023/0016588 | A1* | 1/2023 | Park | H10K 85/342 |
| 2023/0028409 | A1* | 1/2023 | Kim | H10K 59/38 |
| 2023/0050385 | A1* | 2/2023 | Lee | G06F 3/0412 |
| 2023/0060722 | A1* | 3/2023 | Kim | H10K 59/873 |
| 2023/0082757 | A1* | 3/2023 | Lee | H10K 59/124 |
| | | | | 257/40 |
| 2023/0084087 | A1* | 3/2023 | Choi | H10K 50/16 |
| | | | | 257/40 |

FOREIGN PATENT DOCUMENTS

| | | | |
|---|---|---|---|
| KR | 1020170105994 A | 9/2017 |
| KR | 1020180082661 A | 7/2018 |
| KR | 1020190086605 A | 7/2019 |
| KR | 1020190128010 A | 11/2019 |
| KR | 1020210003989 A | 1/2021 |
| KR | 1020210008240 A | 1/2021 |
| KR | 102262677 B1 | 6/2021 |
| KR | 1020210091384 A | 7/2021 |
| KR | 102363290 B1 | 2/2022 |
| KR | 1020220058720 A | 5/2022 |

* cited by examiner

DISPLAY DEVICE INCLUDING LOW REFRACTIVE AND ANTI-REFLECTION LAYERS

This application claims priority to Korean Patent Application No. 10-2022-0071854, filed on Jun. 14, 2022, and all the benefits accruing therefrom under 35 U.S.C. § 119, the content of which in its entirety is herein incorporated by reference.

BACKGROUND

The present disclosure relates to a display device, and in particular, to a display device with improved light extraction efficiency.

Various display devices are being developed for use in multimedia devices such as television sets, mobile phones, tablet computers, computers, gaming machines, and the like. The display device includes various optical/functional layers, which are used to provide a high-quality color image to a user.

Meanwhile, in order to implement the display device with a curved surface, such as a rollable and foldable display device, a thin display device is being actively studied. For example, the display device having a small thickness may be implemented by reducing the number of the optical/functional layers or by providing an optical/functional layer with various functions.

SUMMARY

An embodiment of the present invention provides a display device, which has improved optical efficiency and a small thickness and can be fabricated through a simplified process.

According to an embodiment of the present invention, a display device includes: a display panel; a pattern layer disposed on the display panel; and a low refractive layer covering the pattern layer and having a refractive index lower than a refractive index of the pattern layer. The display panel includes: a base layer; a pixel definition layer disposed on the base layer, where a pixel opening is defined in the pixel definition layer; an emission device including an emission layer disposed in the pixel opening; an anti-reflection layer disposed on the emission device; and an encapsulation layer disposed on the anti-reflection layer. At least one of the pattern layer, the encapsulation layer, and the low refractive layer may include at least one of pigment or dye.

In an embodiment, the pattern layer may be overlapped with the pixel opening in a plan view.

In an embodiment, the pattern layer may include at least one of pigment or dye.

In an embodiment, the display device may further include an input sensor disposed between the display panel and the pattern layer.

In an embodiment, the display device may further include a light-blocking pattern disposed on the display panel. The light-blocking pattern may be not overlapped with the pixel opening in the plan view.

In an embodiment, the display device may further include an input sensor disposed on the display panel. The input sensor may include: a first conductive layer, a second conductive layer, and the pattern layer disposed between the first conductive layer and second conductive layer.

In an embodiment, the pattern layer may include a first portion having a first thickness and a second portion having a second thickness larger than the first thickness.

In an embodiment, the display device may further include a light-blocking pattern, which is disposed between the first portion of the pattern layer and the low refractive layer.

In an embodiment, the input sensor may further include a protection layer covering at least the first portion of the pattern layer.

In an embodiment, the protection layer may cover the first and second portions of the pattern layer, and a refractive index of the protection layer may be equal to the refractive index of one of the pattern layer or the low refractive layer.

In an embodiment, the display device may further include an input sensor disposed on the display panel, and the encapsulation layer may include at least one of pigment or dye.

In an embodiment, the display device may further include a light-blocking pattern disposed on the display panel. The light-blocking pattern may be not overlapped with the pixel opening in the plan view.

In an embodiment, the pattern layer may include a first portion having a first thickness and a second portion having a second thickness larger than the first thickness. The light-blocking pattern may be disposed between the first portion of the pattern layer and the low refractive layer.

In an embodiment, the display device may further include a protection layer covering at least the first portion of the pattern layer. A refractive index of the protection layer may be equal to the refractive index of one of the pattern layer or the low refractive layer.

In an embodiment, the input sensor may include a first conductive layer, a second conductive layer, and the pattern layer disposed between the first conductive layer and second conductive layer.

In an embodiment, the display device may further include an input sensor disposed on the display panel. The low refractive layer may include at least one of pigment or dye.

In an embodiment, the input sensor may include a first conductive layer, a second conductive layer, and the pattern layer disposed between the first conductive layer and second conductive layer.

In an embodiment, the pattern layer may include a first portion having a first thickness and a second portion having a second thickness larger than the first thickness. The display device may further include a light-blocking pattern disposed between the first portion of the pattern layer and the low refractive layer, and a protection layer covering the first and second portions of the pattern layer. A refractive index of the protection layer may be equal to the refractive index of one of the pattern layer or the low refractive layer.

In an embodiment, the pigment or dye, which is included in at least one of the pattern layer, the encapsulation layer, and the low refractive layer, may have a peak absorption wavelength at each of a first wavelength range and a second wavelength range different from the first wavelength range.

In an embodiment, the anti-reflection layer may include at least one selected from the group consisting of bismuth (Bi) and ytterbium (Yb).

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 10A to 10H are sectional views illustrating a method of fabricating a display device, according to an embodiment of the present invention.

Figure 1:
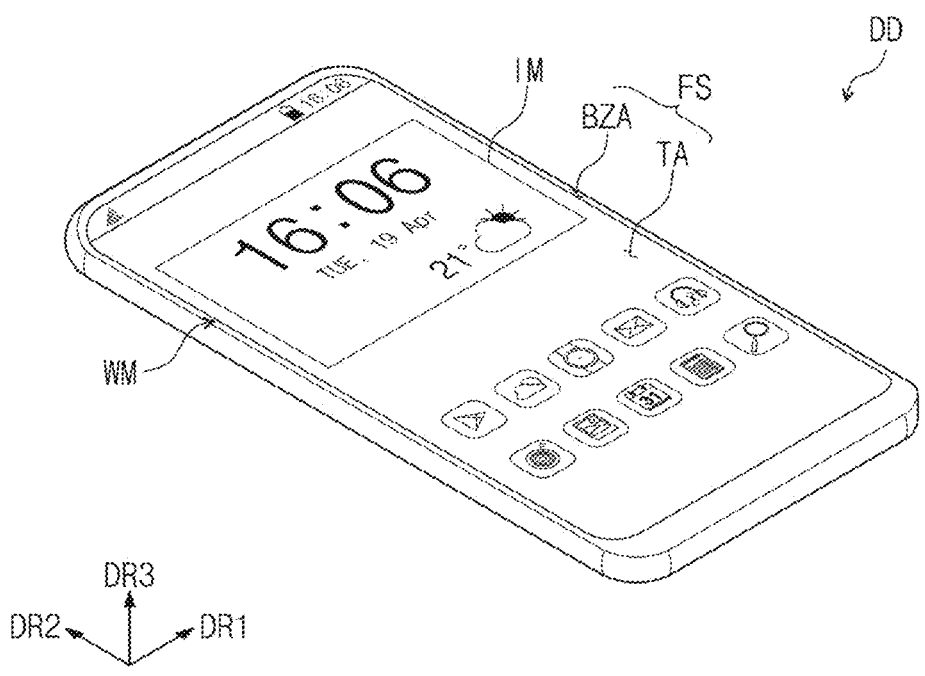
FIG. 1 is a perspective view illustrating a display device according to an embodiment of the present invention.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the present inventions will now be described more fully with reference to the accompanying drawings, in which example embodiments are shown. Example embodiments of the present inventions may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer, or section. Thus, a first element, component, region, layer, or section discussed below could be termed a second element, component, region, layer, or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. "An element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the present inventions are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the present inventions should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which example embodiments of the present inventions belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
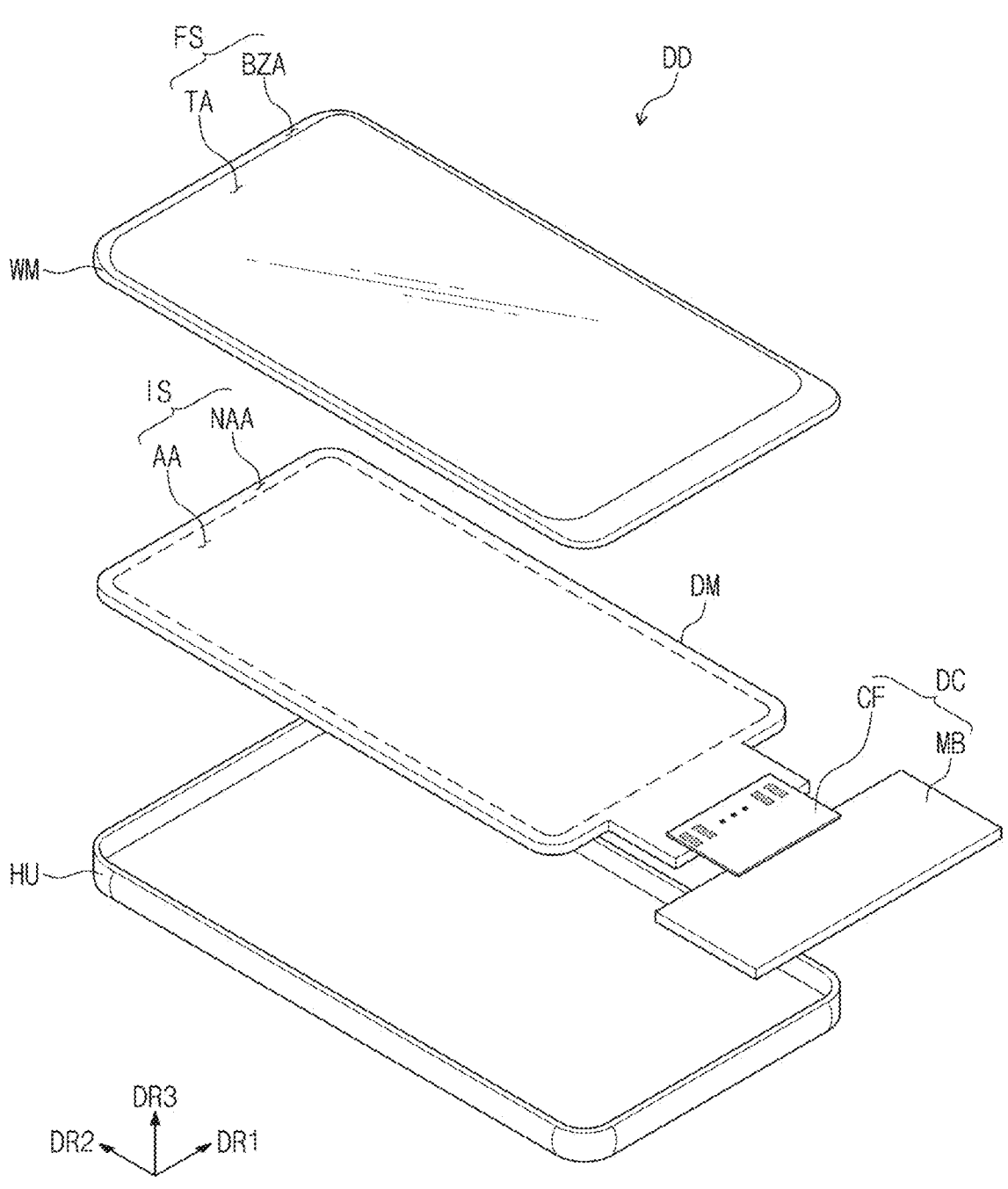
FIG. 2 is an exploded perspective view illustrating a display device according to an embodiment of the present invention.
Figure 3:
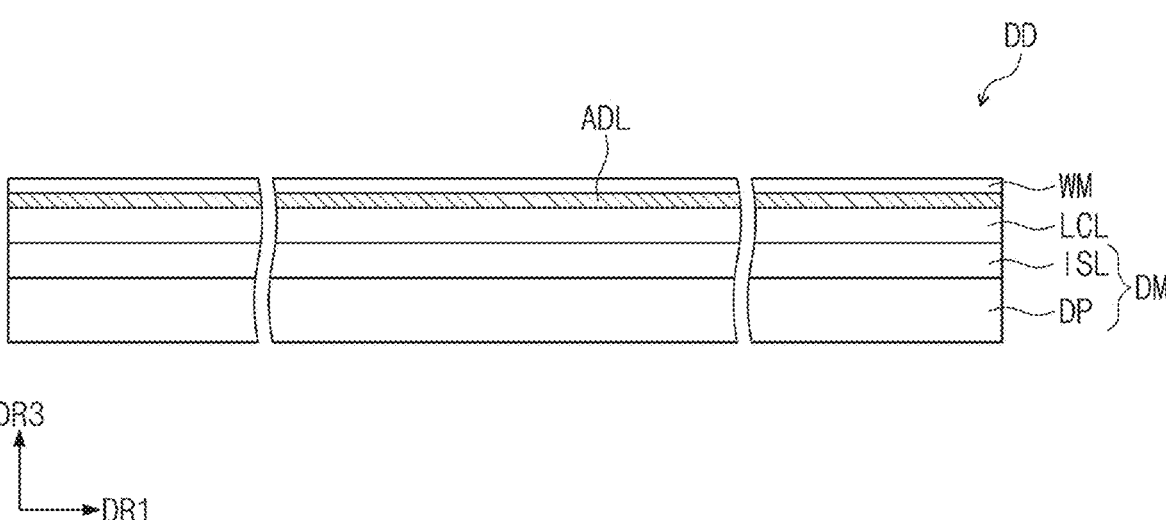
FIG. 3 is a sectional view illustrating a display device according to an embodiment of the present invention.

FIG. 1 is a perspective view illustrating a display device according to an embodiment of the present invention. FIG. 2 is an exploded perspective view illustrating a display device according to an embodiment of the present invention. FIG. 3 is a sectional view illustrating a display device according to an embodiment of the present invention.

Referring to FIG. 1, a display device DD may be activated by an electrical signal. The display device DD may be realized in various forms. For example, the display device DD may be used for various electronic devices, such as portable phones, smart watches, tablets, laptop computers, computers, and smart television sets. However, the display device DD is not limited to these examples, and other display devices may be used to realize the present invention, unless they do not depart from the present invention. In the present embodiment, a portable phone will be described as an example of the display device DD.

The display device DD may include a display surface FS, which is parallel to each of a first direction DR1 and a second direction DR2 and is used to display an image IM in a third direction DR3. The image IM may be a video image or a still image. FIG. 1 illustrates a clock and icons as an example of the image IM. The display surface FS, on which the image IM is displayed, may correspond to a front surface of the display device DD and to a front surface of a window WM.

In the present specification, a front or top surface and a rear or bottom surface of each element or member may be defined, based on a display direction of the image IM or the third direction DR3. The front surface and the rear surface may be opposite to each other in the third direction DR3, and a direction normal to each of the front and rear surfaces may be parallel to the third direction DR3. A distance between the front and rear surfaces in the third direction DR3 may correspond to a thickness of the display device DD defined in the third direction DR3. In the present specification, the expression "in a plan view" means that the structure under consideration is observed in the third direction DR3. Meanwhile, directions indicated by the first to third directions DR1, DR2, and DR3 may be defined in a relative manner, and in an embodiment, they may be changed to indicate other directions.

Referring to FIGS. 1 and 2, the display device DD may include a window WM, a display module DM, a driving circuit DC, and a housing HU. The window WM and the housing HU may be combined to each other to define an outer appearance of the display device DD.

The window WM may include an optically transparent insulating material. For example, the window WM may be formed of or include glass or plastic materials. The window WM may have a multi- or single-layered structure. For example, the window WM may include a plurality of plastic films, which are combined to each other by an adhesive material, or a glass substrate and a plastic film, which are combined to each other by an adhesive material.

The front surface of the window WM may define the display surface FS of the display device DD, as described above. A transmission region TA may be an optically transparent region. For example, the transmission region TA may be a region having transmittance of about 90% or higher to a visible light.

A bezel region BZA may have relatively low optical transmittance, compared with the transmission region TA. The bezel region BZA may define the shape of the transmission region TA. The bezel region BZA may be provided adjacent to the transmission region TA to surround the transmission region TA.

The bezel region BZA may have a predetermined color. Meanwhile, this is an embodiment of the present invention, and in another embodiment, the bezel region BZA may be omitted from the window WM.

The display module DM may be configured to display the image IM and to sense an external input. The display module DM may include a front surface IS including an active region AA and a peripheral region NAA. The active region AA may be a region that is activated by an electrical signal.

In the present embodiment, the active region AA may be a region, which is configured to display the image IM and to sense the external input. The transmission region TA may be overlapped with at least a portion of the active region AA in a plan view. For example, the transmission region TA may be overlapped with the entirety or at least a portion of the active region AA.

Accordingly, a user may watch the image IM through the transmission region TA or may provide an external input to the display module DM through the transmission region TA. However, the present invention is not limited to this example, and in an embodiment, the active region AA of the display module DM may include two different regions, which are used to display the image IM and to sense the external input, respectively.

The peripheral region NAA may be adjacent to the active region AA. The peripheral region NAA may enclose the active region AA. A driving circuit or a driving line, which is used to drive the active region AA, may be provided in the peripheral region NAA. The peripheral region NAA may be a region covered with the bezel region BZA, and thus, the peripheral region NAA may be prevented from being recognized by a user.

The driving circuit DC may include a flexible circuit board CF and a main circuit board MB. The flexible circuit board CF may be electrically connected to the display module DM. The flexible circuit board CF may connect the display module DM to the main circuit board MB. However, the present invention is not limited to this example, and in an embodiment, the flexible circuit board CF may not be connected to a separate circuit board.

The flexible circuit board CF may be coupled to pads of the display module DM disposed in the peripheral region NAA. The flexible circuit board CF may provide electrical signals, which are used to drive the display module DM, to the display module DM. The electrical signals may be generated by the flexible circuit board CF or the main circuit board MB.

The main circuit board MB may include a variety of driving circuits, which are used to drive the display module DM, or a connector, which is used to supply an electric power. The main circuit board MB may be coupled to the display module DM through the flexible circuit board CF.

The housing HU may be combined with the window WM. In this case, the housing HU and the window WM may define an internal space. The display module DM may be disposed in the internal space.

The housing HU may be formed of or include a material with relatively high hardness. For example, the housing HU may include at least one of glass, plastic, or metallic materials or may include a plurality of frames and/or plates that are made of the glass, plastic, or metallic materials. The housing HU may stably protect elements of the display device DD, which are disposed in the internal space, from an external impact.

FIG. 3 is a sectional view illustrating a display device according to an embodiment of the present invention. In order to describe a stacking structure of a functional panel and/or functional units in the display device DD, the display device DD is illustrated in a simplified manner in FIG. 3.

The display device DD may include the display module DM, a light control layer LCL, and the window WM. The display module DM may include a display panel DP and an input sensor ISL.

The display panel DP may generate an image. The display panel DP may include a plurality of pixels PX (e.g., see FIG. 4A). The display panel DP may be a light-emitting type display panel, in which a light-emitting element is used as a display element, but the present invention is not limited to this example or a specific embodiment. For example, the display panel DP may be an organic light-emitting display panel or an inorganic light-emitting display panel. A light-emitting layer of the organic light-emitting display panel may be formed of or include an organic luminescent material. A light-emitting layer of the inorganic light-emitting display panel may include quantum dots, quantum rods, or inorganic LEDs. Hereinafter, an organic light-emitting display panel may be described as an example of the display panel DP.

The input sensor ISL may be disposed on the display panel DP. The input sensor ISL may be configured to obtain information on coordinates of an external input (e.g., a touch event). The input sensor ISL may be configured to sense an external input (e.g., in a capacitance sensing manner).

The light control layer LCL may be disposed on the input sensor ISL. In the present embodiment, the light control layer LCL may include a pattern layer PTL and a low refractive layer CVL to be described with reference to FIG. 7. The pattern layer PTL and the low refractive layer CVL may have refractive indices that are different from each other.

The light control layer LCL may be configured to control a propagation path of a light (hereinafter, source light) which is generated in the display panel DP. For example, the light control layer LCL may concentrate the source light that is generated in a region of the display panel DP. In addition, the light control layer LCL may be configured to reduce reflectance of a natural or solar light that is incident from an outer space to the window WM.

The light control layer LCL may not include a polarization layer. Accordingly, the natural light, which passes through the light control layer LCL and is incident into the display panel DP and the input sensor ISL, may not be polarized. The display panel DP and the input sensor ISL may receive the natural light that is incident through the light control layer LCL and is in an unpolarized state.

The window WM may be disposed over the light control layer LCL. The window WM and the light control layer LCL may be combined to each other by a window adhesive layer ADL. The window adhesive layer ADL may be a pressure sensitive adhesive ("PSA") film or an optically clear adhesive ("OCA") layer.

Figure 4A:
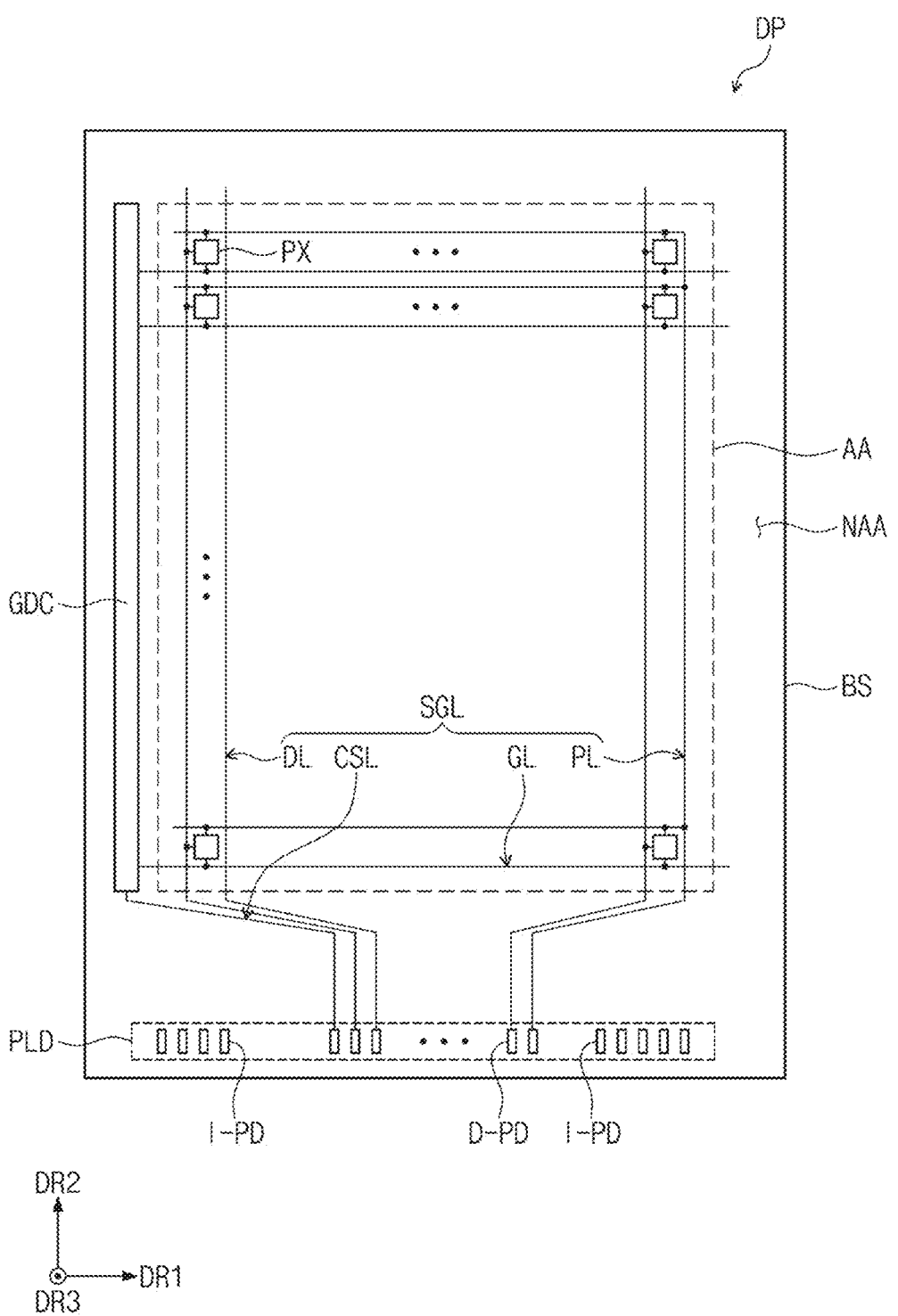
FIG. 4A is a plan view illustrating a display panel according to an embodiment of the present invention.
Figure 4B:
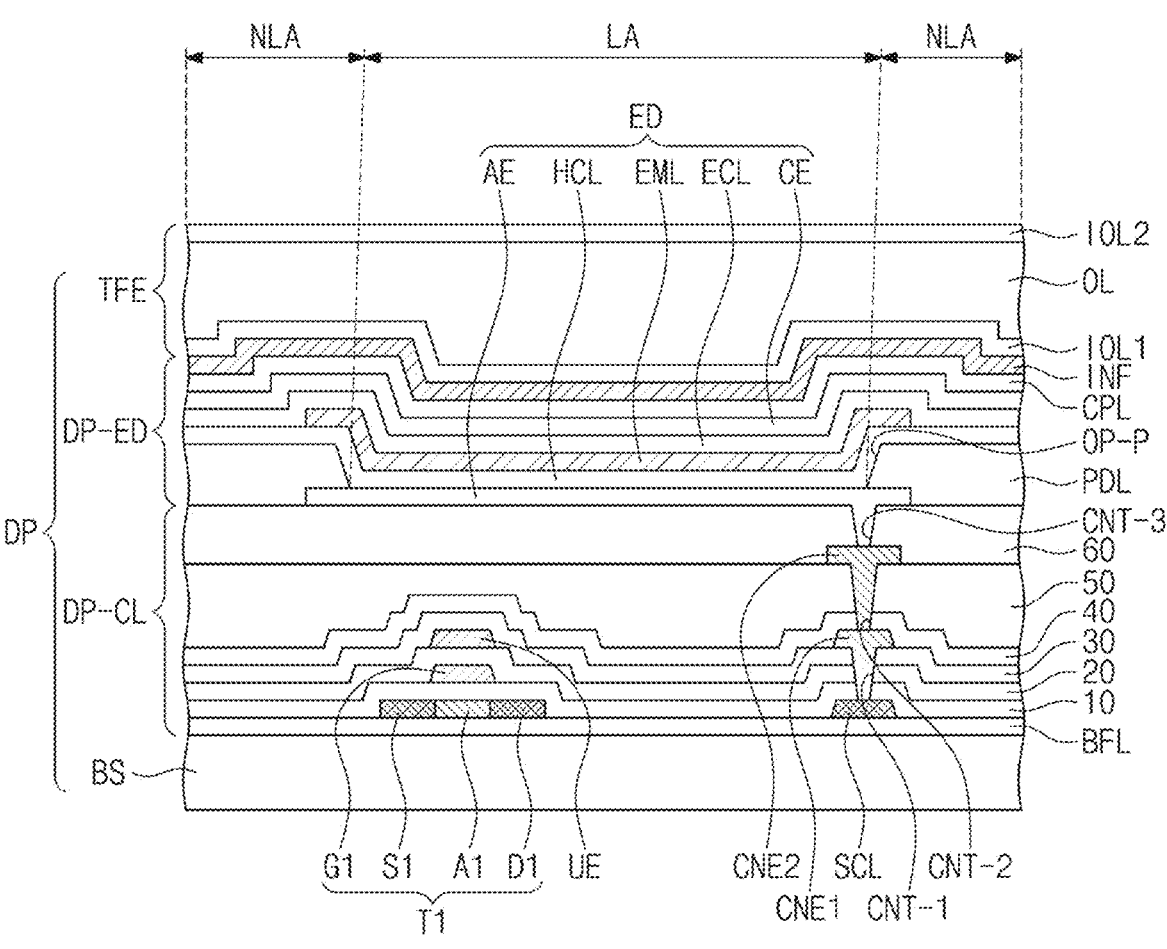
FIG. 4B is a sectional view illustrating a display panel according to an embodiment of the present invention.

FIG. 4A is a plan view illustrating a display panel according to an embodiment of the present invention. FIG. 4B is a sectional view illustrating a display panel according to an embodiment of the present invention.

Referring to FIG. 4A, the display panel DP may include a base layer BS, in which two different regions (e.g., the active region AA and the peripheral region NAA) are defined.

The display panel DP may include the pixels PX, which are disposed in the active region AA, and signal lines SGL, which are electrically connected to the pixels PX. The display panel DP may include an integrated driving circuit GDC and a pad portion PLD, which are disposed in the peripheral region NAA.

The pixels PX may be arranged in the first direction DR1 and the second direction DR2. The pixels PX may be provided to form a plurality of pixel rows, which are extended in the first direction DR1 and are arranged in the second direction DR2, and a plurality of pixel columns, which are extended in the second direction DR2 and are arranged in the first direction DR1.

The signal lines SGL may include gate lines GL, data lines DL, a power line PL, and a control signal line CSL. Each of the gate lines GL may be connected to a corresponding one of the pixels PX, and each of the data lines DL may be connected to a corresponding one of the pixels PX. The power line PL may be electrically connected to the pixels PX. The control signal line CSL may be connected to the integrated driving circuit GDC to provide control signals to the integrated driving circuit GDC.

The integrated driving circuit GDC may include a gate driving circuit. The gate driving circuit may be configured to generate gate signals and to sequentially output the generated gate signals to the gate lines GL. In addition, the gate driving circuit may be configured to further output other signals (e.g., emission control signals) to the pixels PX.

The pad portion PLD may be a portion connected to the flexible circuit board CF described with reference to FIG. 2. The pad portion PLD may include pixel pads D-PD and input pads I-PD.

The pixel pads D-PD may be used to connect the flexible circuit board CF to the display panel DP. Each of the pixel pads D-PD may be connected to a corresponding one of the signal lines SGL. The pixel pads D-PD may be connected to corresponding ones of the pixels PX through the signal lines SGL. In addition, one of the pixel pads D-PD may be connected to the integrated driving circuit GDC.

The input pads I-PD may be used to connect the flexible circuit board CF to the input sensor ISL (e.g., see FIG. 3). FIG. 4A illustrates an example in which the input pads I-PD are disposed in the display panel DP, but the present invention is not limited to this example. For example, the input pads I-PD may be disposed in the input sensor ISL and may be connected to a circuit board, which is different from that for the pixel pads D-PD.

Referring to FIG. 4B, the display panel DP may include a base layer BS, a circuit device layer DP-CL, a display device layer DP-ED, and an encapsulation layer TFE.

The base layer BS may include a synthetic resin film. In an embodiment, the base layer BS may include a glass substrate, a metal substrate, or an organic/inorganic composite substrate.

At least one inorganic layer may be disposed on a top surface of the base layer BS. A buffer layer BFL may be provided to increase an adhesion strength between the base layer BS and the semiconductor pattern. The buffer layer BFL may include a silicon oxide layer and a silicon nitride layer. The silicon oxide layer and the silicon nitride layer may be alternately stacked.

The display panel DP may include a plurality of insulating layers, a semiconductor pattern, a conductive pattern, and a plurality of signal lines. An insulating layer, a semiconductor layer, and a conductive layer may be formed by a coating or deposition process. Thereafter, the insulating layer, the semiconductor layer, and the conductive layer may be selectively patterned by a photolithography and etching process. This method may be used to form the semiconductor patterns, the conductive patterns, and the signal lines constituting the circuit device layer DP-CL and the display device layer DP-ED.

The semiconductor pattern may be disposed on the buffer layer BFL. The semiconductor pattern may be formed of or include polysilicon. However, the present invention is not limited to this example, and the semiconductor pattern may be formed of or include at least one of amorphous silicon or metal oxide materials in another embodiment.

Figure 6:
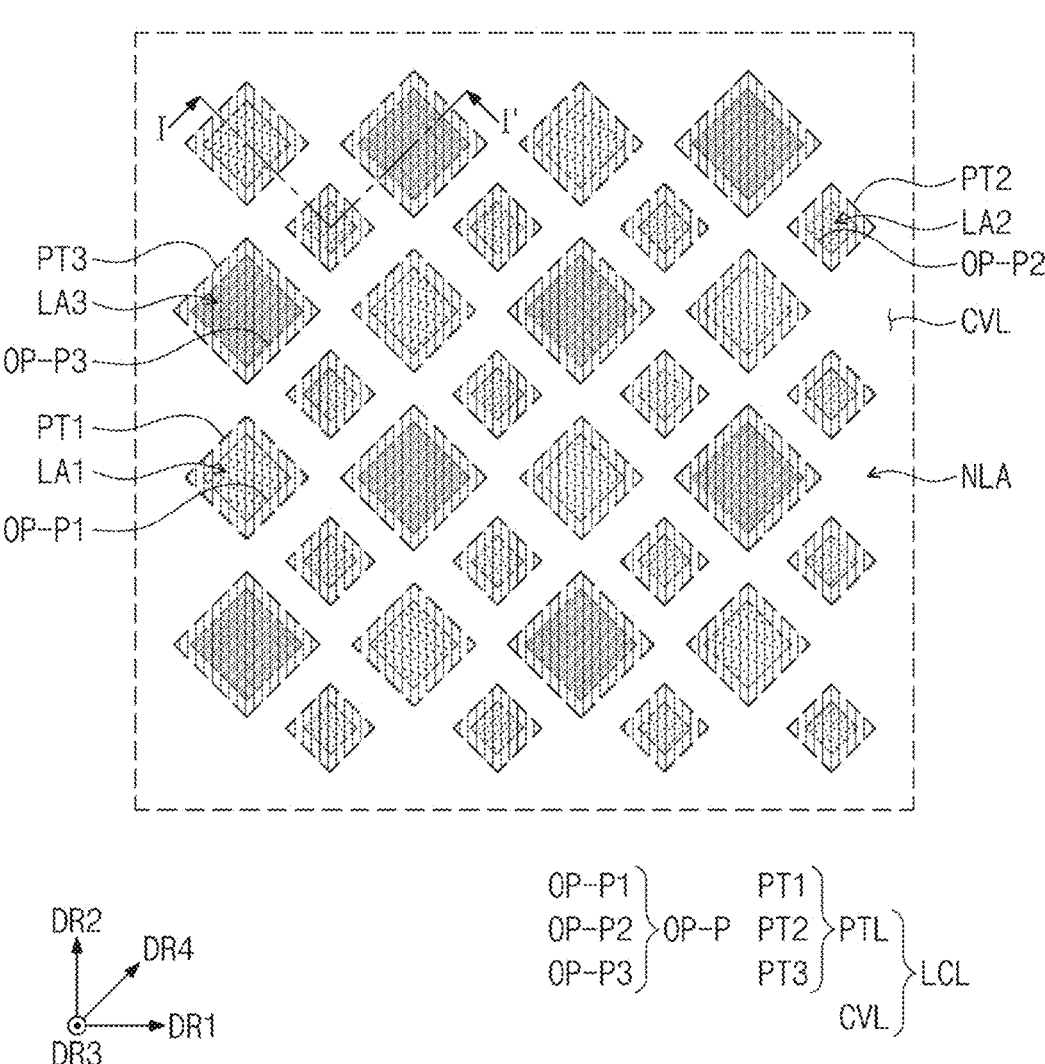
FIG. 6 is an enlarged plan view illustrating an active region of a display panel according to an embodiment of the present invention.

FIG. 4B illustrates a portion of the semiconductor pattern, and in a plan view, the semiconductor pattern may be further disposed in a plurality of emission regions LA1, LA2, and LA3, (e.g., see FIG. 6). In an embodiment, the semiconductor patterns may be arranged throughout a plurality of emission regions under a specific rule. Electrical characteristics of the semiconductor pattern may be changed depending on its doping state. The semiconductor pattern may include a first region with a high doping concentration and a second region with a low doping concentration. The first region may be doped with n-type or p-type dopants. A p-type transistor may include the first region that is doped with the p-type dopants.

The first region may have an electric conductivity higher than the electric conductivity of the second region and may be substantially used as an electrode or a signal line. The second region may be substantially used as a channel region of a transistor. In other words, the semiconductor pattern may include at least three different regions, one of which is the channel region of the transistor, another of which is the source or drain region of the transistor, and the other of which is a conductive region.

As shown in FIG. 4B, a source region S1, a channel region A1, a drain region D1 of a transistor T1 may be formed from the semiconductor pattern. In an embodiment, a portion of the semiconductor pattern may be used as a signal transmission region SCL illustrated in FIG. 4B. Although not shown, the signal transmission region SCL may be connected to the drain region D1 of the transistor T1 in a plan view.

First to sixth insulating layers 10 to 60 may be disposed on the buffer layer BFL. Each of the first to sixth insulating layers 10 to 60 may be an inorganic layer or an organic layer. A gate G1 may be disposed on the first insulating layer 10. An upper electrode UE may be disposed on the second insulating layer 20. A first connection electrode CNE1 may be disposed on the third insulating layer 30. The first connection electrode CNE1 may be coupled to the signal transmission region SCL through a contact hole CNT-1, which is formed to penetrate the first to third insulating layers 10 to 30. The fourth and fifth insulating layers 40 and 50 may be disposed on the third insulating layer 30. In an embodiment, the fourth and fifth insulating layers 40 and 50 may be organic layers.

A second connection electrode CNE2 may be disposed on the fifth insulating layer 50. The second connection electrode CNE2 may be coupled to the first connection electrode CNE1 through a contact hole CNT-2, which is formed to penetrate the fourth and fifth insulating layers 40 and 50.

The display device layer DP-ED may be disposed on the circuit device layer DP-CL. In the present embodiment, the display device layer DP-ED may include an emission device ED, a pixel definition layer PDL, a capping layer CPL, and an anti-reflection layer INF.

The emission device ED may be disposed over the sixth insulating layer 60. In the present embodiment, the emission device ED may include a first electrode AE, a hole control layer HCL, an emission layer EML, an electron control layer ECL, and a second electrode CE.

The first electrode AE may be disposed on the sixth insulating layer 60. The first electrode AE may be connected to the second connection electrode CNE2 through a contact hole CNT-3, which is formed to penetrate the sixth insulating layer 60. The pixel definition layer PDL may be disposed on the sixth insulating layer 60. A pixel opening OP-P may be defined in the pixel definition layer PDL. The pixel opening OP-P may expose at least a portion of the first electrode AE. An emission region LA may be defined to correspond to a portion of the first electrode AE exposed through the pixel opening OP-P. A non-emission region NLA may correspond to a remaining region of the active region AA (e.g., see FIG. 2), except for the emission region LA.

In an embodiment, the pixel definition layer PDL may include a light absorption material. The pixel definition layer PDL may be formed of or include a black coloring agent. The black coloring agent may contain black dye or black pigment. The black coloring agent may contain metallic materials (e.g., carbon black and chromium) or oxides thereof.

The hole control layer HCL may be disposed on the first electrode AE. The hole control layer HCL may be disposed in common in the emission region LA and the non-emission region NLA. The hole control layer HCL may include a hole transport layer and, in an embodiment, the hole control layer HCL may further include a hole injection layer.

The emission layer EML may be disposed on the hole control layer HCL. The emission layer EML may be disposed in a region corresponding to the pixel opening OP-P. In other words, the emission layer EML may be disposed to correspond to the emission region LA.

The electron control layer ECL may be disposed on the emission layer EML. The electron control layer ECL may include an electron transport layer, and in an embodiment, the electron control layer ECL may further include an electron injection layer. The second electrode CE may be disposed on the electron control layer ECL. The electron control layer ECL and the second electrode CE may be disposed in common in the emission region LA and the non-emission region NLA.

The capping layer CPL may be disposed on the second electrode CE. The capping layer CPL may be disposed in common in the emission region LA and the non-emission region NLA.

In an embodiment, the capping layer CPL may be formed of or include an inorganic material. The capping layer CPL may be formed by a sputtering deposition process.

Since the capping layer CPL covers the second electrode CE, the capping layer CPL may protect the second electrode CE and the emission layer EML from a contamination material or moisture supplied from the outside. In addition, by adjusting a refractive index and thickness of the capping layer CPL, it may be possible to prevent or suppress light from being totally reflected an interface between the second electrode CE and the capping layer CPL.

The anti-reflection layer INF may be disposed on the capping layer CPL. The anti-reflection layer INF may be directly disposed on the capping layer CPL. The anti-reflection layer INF may be disposed in common in the emission region LA and the non-emission region NLA.

The anti-reflection layer INF may be a layer that is configured to prevent or suppress an external light from being reflected from the second electrode CE. More specifically, since destructive interference occurs between light reflected from the anti-reflection layer INF and light reflected from the second electrode CE, it may be possible to reduce an amount of the external light reflected from the second electrode CE. Here, the destructive interference means an optical cancellation phenomenon, which may occur between light beams, when the light beams have a phase difference of about 180° and have the same intensity.

Thicknesses of the anti-reflection and capping layers INF and CPL may be adjusted such that the destructive interference occurs between light beams, which are reflected from the anti-reflection layer INF and the second electrode CE, respectively.

The anti-reflection layer INF may be formed of or include an inorganic material. For example, the anti-reflection layer INF may be formed of or include at least one selected from the group consisting of bismuth (Bi) and ytterbium (Yb). In an embodiment, the anti-reflection layer INF may be formed of bismuth (Bi) or may be formed of ytterbium (Yb). In addition, the anti-reflection layer INF may include an alloy. For example, the anti-reflection layer INF may include a mixed deposition material, such as $Yb_xBi_y$. The anti-reflection layer INF may be formed by a sputtering deposition process.

The encapsulation layer TFE may be disposed on the anti-reflection layer INF. The encapsulation layer TFE may be a thin encapsulation layer. The encapsulation layer TFE may be a single layer or may include a plurality of stacked layers. The encapsulation layer TFE may include at least one organic layer.

In an embodiment, the encapsulation layer TFE may include a first inorganic layer IOL1, an organic layer OL, and a second inorganic layer IOL2. The first inorganic layer IOL1 may be disposed on the anti-reflection layer INF. The organic layer OL may be disposed on the first inorganic layer IOU. The second inorganic layer IOL2 may be disposed on the organic layer OL to cover the organic layer OL.

The first inorganic layer IOL1 and the second inorganic layer IOL2 may protect the display device layer DP-ED from moisture and/or oxygen, and the organic layer OL may protect the display device layer DP-ED from a contamination material (e.g., a dust particle).

Figure 5:
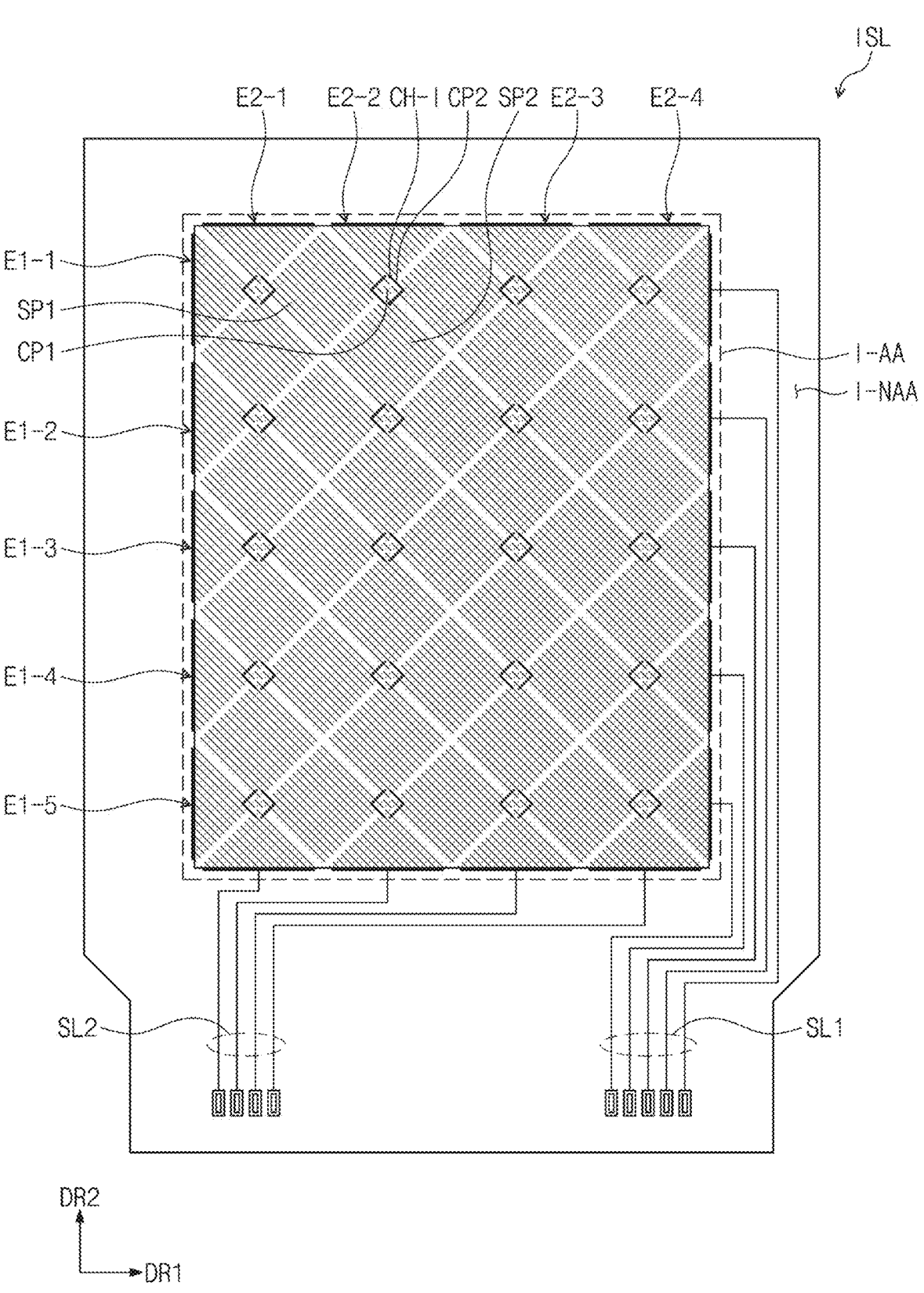
FIG. 5 is a plan view illustrating an input sensor according to an embodiment of the present invention.

FIG. 5 is a plan view illustrating an input sensor according to an embodiment of the present invention.

Referring to FIG. 5, the input sensor ISL may include first electrodes E1-1 to E1-5 and second electrodes E2-1 to E2-4, which are disposed in an active region I-AA to cross each other in an electrically-disconnected manner. The input sensor ISL may include first signal lines SL1, which are disposed in a peripheral region I-NAA and are electrically connected to the first electrodes E1-1 to E1-5, and second signal lines SL2, which are disposed in the peripheral region I-NAA and are electrically connected to the second electrodes E2-1 to E2-4. The first electrodes E1-1 to E1-5, the second electrodes E2-1 to E2-4, the first signal lines SL1, and the second signal lines SL2 may be defined through a combination of first and second conductive layers CL1 and CL2 (e.g., see FIG. 8A).

Each of the first and second electrodes E1-1 to E1-5 and E2-1 to E2-4 may include a plurality of conductive lines that are disposed to cross each other. The conductive lines may be provided to define a plurality of openings, and each of the first and second electrodes E1-1 to E1-5 and E2-1 to E2-4 may have a mesh shape. Each of the openings may be defined to correspond to the emission region LA (e.g., see FIG. 4B) of the display panel DP (e.g., see FIG. 3).

One of the first and second electrodes E1-1 to E1-5 and E2-1 to E2-4 may be provided as a single object. In the present embodiment, each of the first electrodes E1-1 to E1-5 are illustrated to be a single object. The first electrodes E1-1 to E1-5 may include first sensing portions SP1 and first connecting portions CP1. A portion of the afore-described second conductive layer CL2 (e.g., see FIG. 8A) may correspond to the first electrodes E1-1 to E1-5.

Each of the second electrodes E2-1 to E2-4 may include second sensing portions SP2 and second connecting portions CP2. Two adjacent ones of the second sensing portions SP2 may be connected to two second connecting portions CP2 through a contact hole CNT-A penetrating a second sensing insulating layer IL2 (e.g., see FIG. 8A), but the number of the second connecting portions CP2 is not limited thereto. Portions of the second conductive layer CL2 may correspond to the second sensing portions SP2 in another embodiment. Portions of the first conductive layer CL1 (e.g., see FIG. 8A) may correspond to the second connecting portions CP2.

In the present embodiment, the second connecting portions CP2 may be formed from the first conductive layer CL1, and the first electrodes E1-1 to E1-5 and the second sensing portions SP2 may be formed from the second conductive layer CL2, but the present invention is not limited to this example. For example, the first electrodes E1-1 to E1-5 and the second sensing portions SP2 may be formed from the first conductive layer CL1, and the second connecting portions CP2 may be formed from the second conductive layer CL2.

One of the first and second signal lines SL1 and SL2 may be configured to receive a transmission signal from an external circuit to sense an external input, and the other of the first and second signal lines SL1 and SL2 may be configured to deliver a change in electrostatic capacitance between the first electrodes E1-1 to E1-5 and the second electrodes E2-1 to E2-4 to the external circuit as a reception signal.

A portion of the second conductive layer CL2 may correspond to the first and second signal lines SL1 and SL2. The first and second signal lines SL1 and SL2 may have a double-layered structure and may include a first layer line and a second layer line, which are formed from the first conductive layer CL1 and the second conductive layer CL2, respectively. The first layer line and the second layer line may be electrically connected to each other through the contact hole CNT-A penetrating the second sensing insulating layer IL2.

Figure 7A:
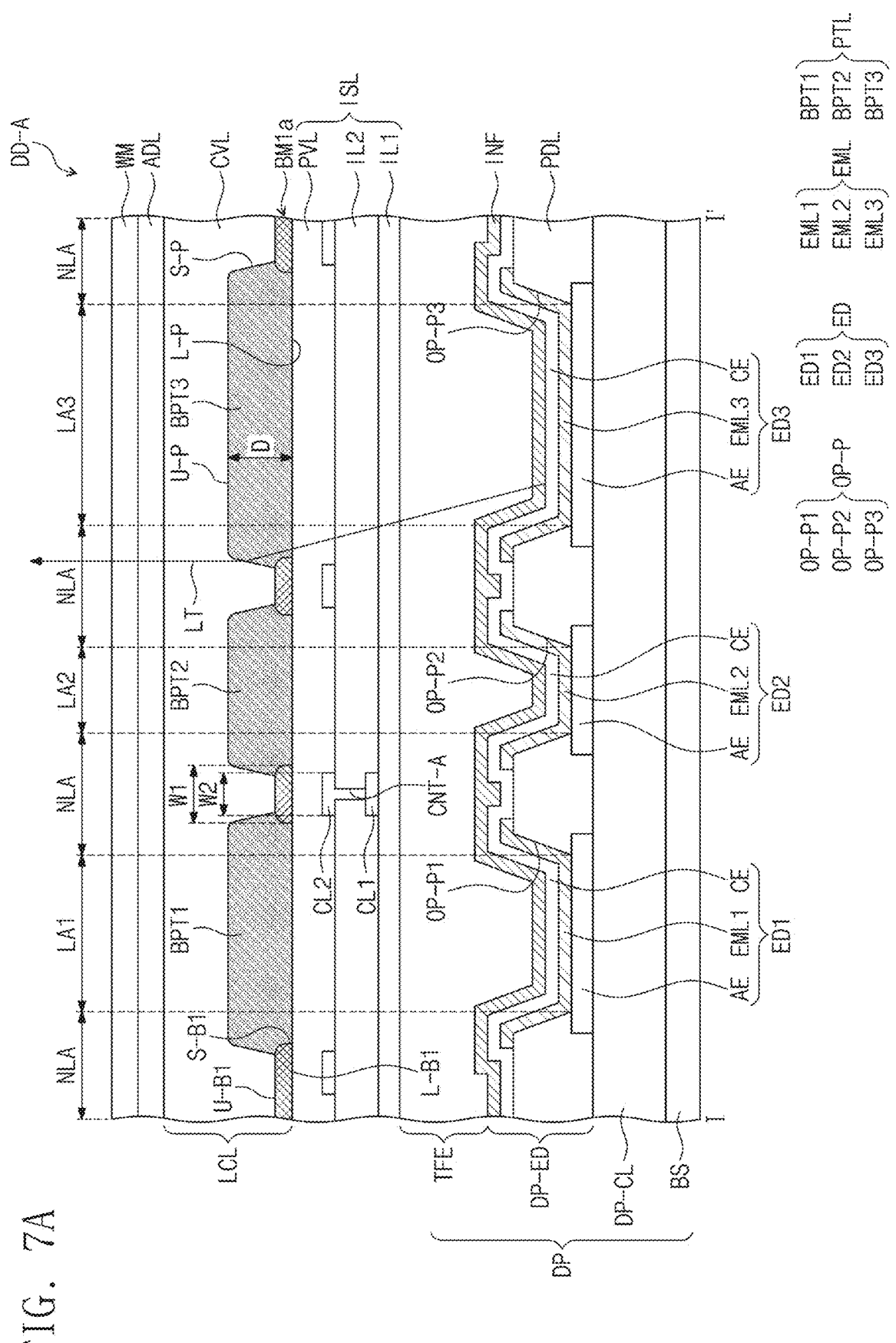
FIG. 7A is a sectional view taken along line I-I' of FIG. 6 to illustrate a display device according to an embodiment of the present invention.

FIG. 6 is an enlarged plan view illustrating an active region of a display panel according to an embodiment of the present invention. FIG. 7A is a sectional view taken along line I-I' of FIG. 6 to illustrate a display device according to an embodiment of the present invention.

Referring to FIGS. 6 and 7A, the pixel definition layer PDL may include a plurality of pixel openings OP-P. The pixel openings OP-P may include a first pixel opening OP-P1, a second pixel opening OP-P2, and a third pixel opening OP-P3, which have different areas from each other in a plan view. In an embodiment, the area of the first pixel opening OP-P1 may be larger than the area of the second pixel opening OP-P2, and may be smaller than the area of the third pixel opening OP-P3 in a plan view.

In the present embodiment, a plurality of the emission devices ED may be provided and may include a first emission device ED1, a second emission device ED2, and a third emission device ED3.

The first emission device ED1 may include the first electrode AE exposed by the first pixel opening OP-P1, a first emission layer EML1 configured to emit a first color light, and the second electrode CE. The first electrode AE in the first emission device ED1 may be exposed by the first pixel opening OP-P1 to define a first emission region LA1.

The second emission device ED2 may include the first electrode AE exposed by the second pixel opening OP-P2, a second emission layer EML2 configured to emit a second color light, and the second electrode CE. The first electrode AE in the second emission device ED2 may be exposed by the second pixel opening OP-P2 to define a second emission region LA2.

The third emission device ED3 may include the first electrode AE exposed by the third pixel opening OP-P3, a third emission layer EML3 configured to emit a third color light, and the second electrode CE. The first electrode AE in the third emission device ED3 may be exposed by the third pixel opening OP-P3 to define a third emission region LA3.

The first and third emission regions LA1 and LA3 may be alternately arranged in the first direction DR1 in a plan view. The second emission regions LA2 may be disposed in a pixel row different from the first and third emission regions LA1 and LA3, and the second emission regions LA2 in the same pixel row may be arranged in the first direction DR1. The first and second emission regions LA1 and LA2 may be alternately arranged in a fourth direction DR4, which is diagonal to the first and second directions DR1 and DR2. The second and third emission regions LA2 and LA3 may be alternately arranged in the fourth direction DR4. However, the arrangement of the first to third emission regions LA1, LA2, and LA3 is not limited to this example.

The first to third color lights may have different colors from each other. For example, the first color light emitted from the first emission region LA1 may be red light, the second color light emitted from the second emission region LA2 may be green light, and the third color light emitted from the third emission region LA3 may be blue light.

However, the present invention is not limited to this example, and in an embodiment, the first to third color lights may be chosen to have three different colors, respectively, which produce a white color light when they are mixed to each other. Alternatively, the first to third color lights may have the same color.

As shown in FIG. 7A, the input sensor ISL may be disposed over the display panel DP. In the present embodiment, the input sensor ISL may be directly disposed on the encapsulation layer TFE.

In the present embodiment, the input sensor ISL may include a first sensing insulating layer ILL the first conductive layer CL1, the second sensing insulating layer IL2, the second conductive layer CL2, and a protection layer PVL.

The first sensing insulating layer IL1 may be disposed on the encapsulation layer TFE. The first conductive layer CL1 may be disposed on the first sensing insulating layer IL1. The second sensing insulating layer IL2 may be disposed on the first sensing insulating layer IL1 to cover the first conductive layer CL1. The second conductive layer CL2 may be disposed on the second sensing insulating layer IL2. The second conductive layer CL2 may be electrically connected to the first conductive layer CL1 through the contact hole CNT-A, which is formed to penetrate the second sensing insulating layer IL2. The protection layer PVL may be disposed on the second sensing insulating layer IL2 to cover the second conductive layer CL2.

Each of the first sensing insulating layer IL', the second sensing insulating layer IL2, and the protection layer PVL may be formed of or include at least one of inorganic and organic materials. Each of the first and second conductive layers CL1 and CL2 may have conductivity and may be provided as a single layer or a plurality of layers.

At least one of the first and second conductive layers CL1 and CL2 may be provided in the form of mesh lines in a plan view. The mesh lines may be spaced apart from the emission layer EML in a plan view. Thus, even when the input sensor ISL is directly formed on the display panel DP, light emitted from the emission device ED may be provided to a user, without interference by the input sensor ISL.

The light control layer LCL may be disposed on the input sensor ISL. In the present embodiment, the light control layer LCL may include the pattern layer PTL and the low refractive layer CVL.

The pattern layer PTL may be disposed on the protection layer PVL. The pattern layer PTL may include a plurality of patterns BPT1, BPT2, and BPT3.

In an embodiment, the pattern layer PTL may include a first pattern BPT1, a second pattern BPT2, and a third pattern BPT3. In a plan view, the first pattern BPT1 may be overlapped with the first pixel opening OP-P1, the second pattern BPT2 may be overlapped with the second pixel opening OP-P2, and the third pattern BPT3 may be overlapped with the third pixel opening OP-P3.

In a plan view, the first pattern BPT1 may be overlapped with the entire region of the first emission region LA1, the second pattern BPT2 may be overlapped with the entire region of the second emission region LA2, and the third pattern BPT3 may be overlapped with the entire region of the third emission region LA3. The first pattern BPT1 may have a shape corresponding to the first emission region LA1 and may have a size that is equal to or larger than a size of the first emission region LA1 in a plan view. The second pattern BPT2 may have a shape corresponding to the second emission region LA2 and may have a size that is equal to or larger than a size of the second emission region LA2 in a plan view. The third pattern BPT3 may have a shape corresponding to the third emission region LA3 and may have a size that is equal to or larger than a size of the third emission region LA3 in a plan view.

The first to third patterns BPT1, BPT2, and BPT3 may have an arrangement corresponding to the arrangement of the first to third emission regions LA1, LA2, and LA3. For example, in a plan view, the first and third patterns BPT1 and BPT3 may be alternately arranged in the first direction DR1. The second patterns BPT2 may be spaced apart from the first and third patterns BPT1 and BPT3 in the second direction DR2 and may be arranged in the first direction DR1. The first and second patterns BPT1 and BPT2 may be alternately arranged in the fourth direction DR4. The second and third patterns BPT2 and BPT3 may be alternately arranged in the fourth direction DR4.

However, the arrangement of the first to third patterns BPT1, BPT2, and BPT3 may not be limited to this example and may be changed depending on the arrangement of the first to third emission regions LA1, LA2, and LA3.

The pattern layer PTL and the low refractive layer CVL may have refractive indices that are different from each other. A source light LT, which is a fraction of light generated by the emission device ED and propagate in a lateral direction or toward a side surface, may be refracted at a side surface S-P of the pattern layer PTL to propagate in a front direction or along a changed path. Accordingly, light emission efficiency, in the front direction, of each of the emission devices ED1, ED2, and ED3 (e.g., see FIG. 8A) may be improved, and thus, the optical efficiency of the display panel DP may be improved. Here, in the case where the difference between refractive indices of the pattern layer PTL and the low refractive layer CVL increases, an amount of the source light LT, which propagates in the lateral direction and is refracted at the side surface S-P of the pattern layer PTL, may be increased, and this may result in an increase of a fraction of light propagating in the front direction and improvement of the optical efficiency of the display panel DP.

In an embodiment, a thickness D of the pattern layer PTL may range from about 2.5 μm to about 3.5 μm. Here, the thickness D of the pattern layer PTL may mean the largest thickness between top and bottom surfaces U-P and L-P of the pattern layer PTL. In the case where the thickness D of the pattern layer PTL is smaller than about 2.5 μm and is larger than about 3.5 μm, there may be a difficulty in a fabrication process, and a process precision and a production yield may be lowered.

A refractive index of the low refractive layer CVL to the green light may be 1.53. Here, a refractive index of the low refractive layer CVL to the red light may be 1.55, and a refractive index of the low refractive layer CVL to the blue light may be 1.56. In addition, the pattern layer PTL may have a refractive index of 1.6 or higher, and the thickness D of the pattern layer PTL may range from about 2.5 μm to about 3.5 μm. Therefore, the refractive index of the low refractive layer CVL may be lower than the refractive index of the pattern layer PTL.

The pattern layer PTL may be a layer including a polymer resin and dye and/or pigment dispersed therein. The dye and/or pigment in the pattern layer PTL may be a material that is transparent to only light within a specific wavelength range.

In an embodiment, the dye and/or pigment may be chosen to have peak absorption wavelengths at each of a first wavelength range and a second wavelength range, which are different from each other. Accordingly, the dye and/or pigment may absorb light within the first and second wavelength ranges, and light, which is not within the first and second wavelength ranges, may pass through the dye and/or pigment. In an embodiment, the first wavelength range may be longer than or equal to about 490 nm and may be shorter than or equal to about 505 nm, and the second wavelength range may be longer than or equal to about 585 nm and may be shorter than or equal to about 600 nm. The dye and/or pigment may absorb about 90% of light within the first and second wavelength ranges. Due to this selective absorption and transmission by the dye and/or pigment in the pattern layer PTL, it may be possible to prevent reflection of natural light and to adjust the color of the source light LT emitted from the display panel DP.

The light control layer LCL may further include a light-blocking pattern BM1*a*. The light-blocking pattern BM1*a* may be disposed on the protection layer PVL of the input sensor ISL. The light-blocking pattern BM1*a* may be disposed between adjacent ones of the first to third patterns BPT1, BPT2, and BPT3. In other words, in a plan view, the light-blocking pattern BM1*a* may be overlapped with a portion of the pattern layer PTL. In a plan view, the light-blocking pattern BM1*a* may be overlapped with the non-emission region NLA but not with the emission regions LA1, LA2, and LA3. In other words, in a plan view, the light-blocking pattern BM1*a* may be overlapped with the pixel definition layer PDL.

The light-blocking pattern BM1*a* may include a bottom surface L-B1 in contact with the protection layer PVL, a top surface U-B1 opposite to the bottom surface L-B1, and a side surface S-B1 connecting the bottom surface L-B1 to the top surface U-B1.

In an embodiment, as shown in FIG. 7A, the side surface S-B1 of the light-blocking pattern BM1*a* may be in contact with the pattern layer PTL. In other words, the side surface S-B1 of the light-blocking pattern BM1*a* may be covered with the pattern layer PTL. Here, the low refractive layer CVL may be in contact with the top surface U-B1 of the light-blocking pattern BM1*a* and may cover the light-blocking pattern BM1*a*.

However, the present invention is not limited to this example, and in an embodiment, the side surface S-B1 of the light-blocking pattern BM1*a* may be spaced apart from the side surface S-P of the pattern layer PTL adjacent thereto. Here, the low refractive layer CVL may be in contact with not only the top and side surfaces U-P and S-P of the pattern layer PTL but also the top and side surfaces U-B1 and S-B1 of a light-blocking pattern BM and may cover the pattern layer PTL and the light-blocking pattern BM1*a*.

The light-blocking pattern BM1*a* may be formed of or include a light absorption material. The light-blocking pattern BM1*a* may be a pattern of a black color and may contain a black coloring agent. The black coloring agent may contain black dye or black pigment. The black coloring agent may contain metallic materials (e.g., carbon black and chromium) or oxides thereof.

A width of the light-blocking pattern BM1*a* measured in a cross-section may be defined as a first width W1, and a width of the first and second conductive layers CL1 and CL2 may be defined as a second width W2. In the present embodiment, the second width W2 may be smaller than or equal to the first width W1. Since the light-blocking pattern BM1*a* is overlapped with the first and second conductive layers CL1 and CL2 of the input sensor ISL in a plan view, it may be possible to reduce the reflectance of an external light caused by the first and second conductive layers CL1 and CL2.

Since the pattern layer PTL contains the dye and/or pigment, the pattern layer PTL may absorb light of a specific wavelength and may be substantially transparent to light within the remaining wavelength range. That is, owing to the pattern layer PTL, only the light within the specific wavelength range, among the external light, may be incident into the input sensor ISL and the display panel DP.

Thus, it may be unnecessary to add a reflection adjusting layer (e.g., a polarization film, a color filter layer, or a light absorption layer including dye and/or pigment), which is desirable to adjust the reflectance of the external light, in the display device DD, and as a result, it may be possible to reduce a thickness of the display device DD, to omit a mask for forming the reflection adjusting layer, and to simplify the fabrication process.

In the present embodiment, since the display device layer DP-ED includes the anti-reflection layer INF, the reflection of the external light may be reduced by the destructive interference of the reflection light, but in this case, an amount of light emitted from the emission device ED may be decreased to cause deterioration in the optical efficiency of the display device. However, according to an embodiment of the present invention, at the light control layer LCL, light emitted from the emission device ED may be concentered in a front direction, and thus, it may be possible to reduce the reflection of the external light at the second electrode CE and to effectively improve the optical efficiency of the display device. In the present embodiment, the window adhesive layer ADL may be disposed on the low refractive layer CVL. The window adhesive layer ADL may have a refractive index, which is equal to or higher than about 1.45 and is equal to or smaller than about 1.5.

In the present embodiment, a difference between the refractive indices of the window adhesive layer ADL and the low refractive layer CVL may be smaller than or equal to about 0.1. Since the difference between the refractive indices of the window adhesive layer ADL and the low refractive layer CVL is reduce, it may be possible to reduce an amount of light reflected at an interface between layers, when the external light is incident into the light control layer LCL through the window WM and the window adhesive layer ADL.

According to an embodiment of the present invention, a difference between the refractive indices of the window adhesive layer ADL and the low refractive layer CVL may be minimized, and in this case, the reflectance of the external light may be reduced by the light control layer LCL. As a result, the display device DD (e.g., see FIG. 1) may be provided to have improved visibility.

According to an embodiment of the present invention, even when a step of attaching a polarization film or adding a color filter layer is omitted, the reflection of the external light may be reduced by the pattern layer PTL and the low refractive layer CVL of the light control layer LCL. Accordingly, this may contribute to a reduction in the thickness of the display device DD and be applied to a foldable display device. In addition, for the color filter layer, several patterning steps should be performed to form color filters for red, green, and blue lights, but the first to third patterns BPT1, BPT2, and BPT3 according to an embodiment of the present invention may be patterned using a single mask. Accordingly, the display device DD may be fabricated by a simplified process.

Figure 7B:
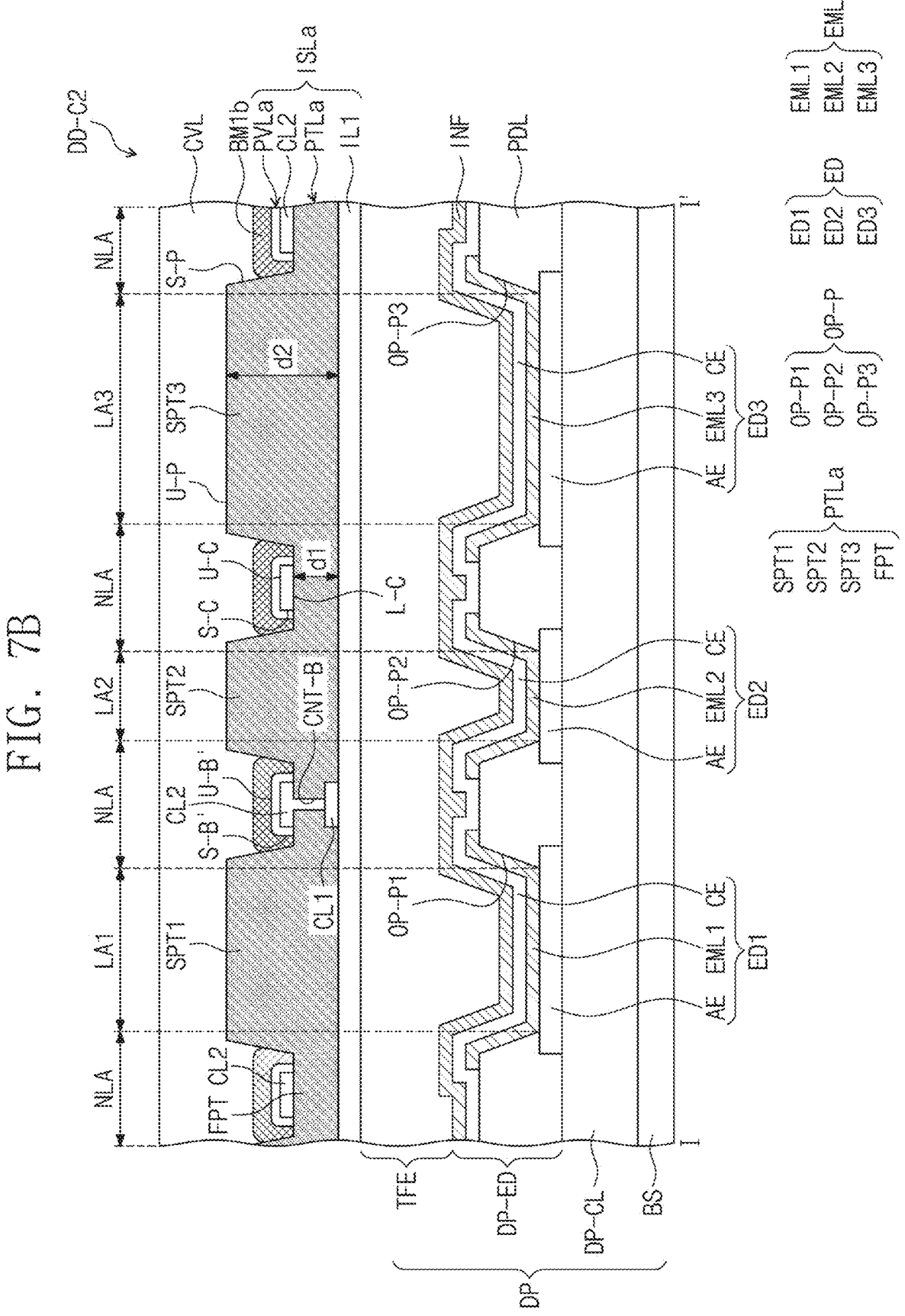
FIG. 7B is a sectional view illustrating a portion of a display device according to an embodiment of the present invention.
Figure 7C:
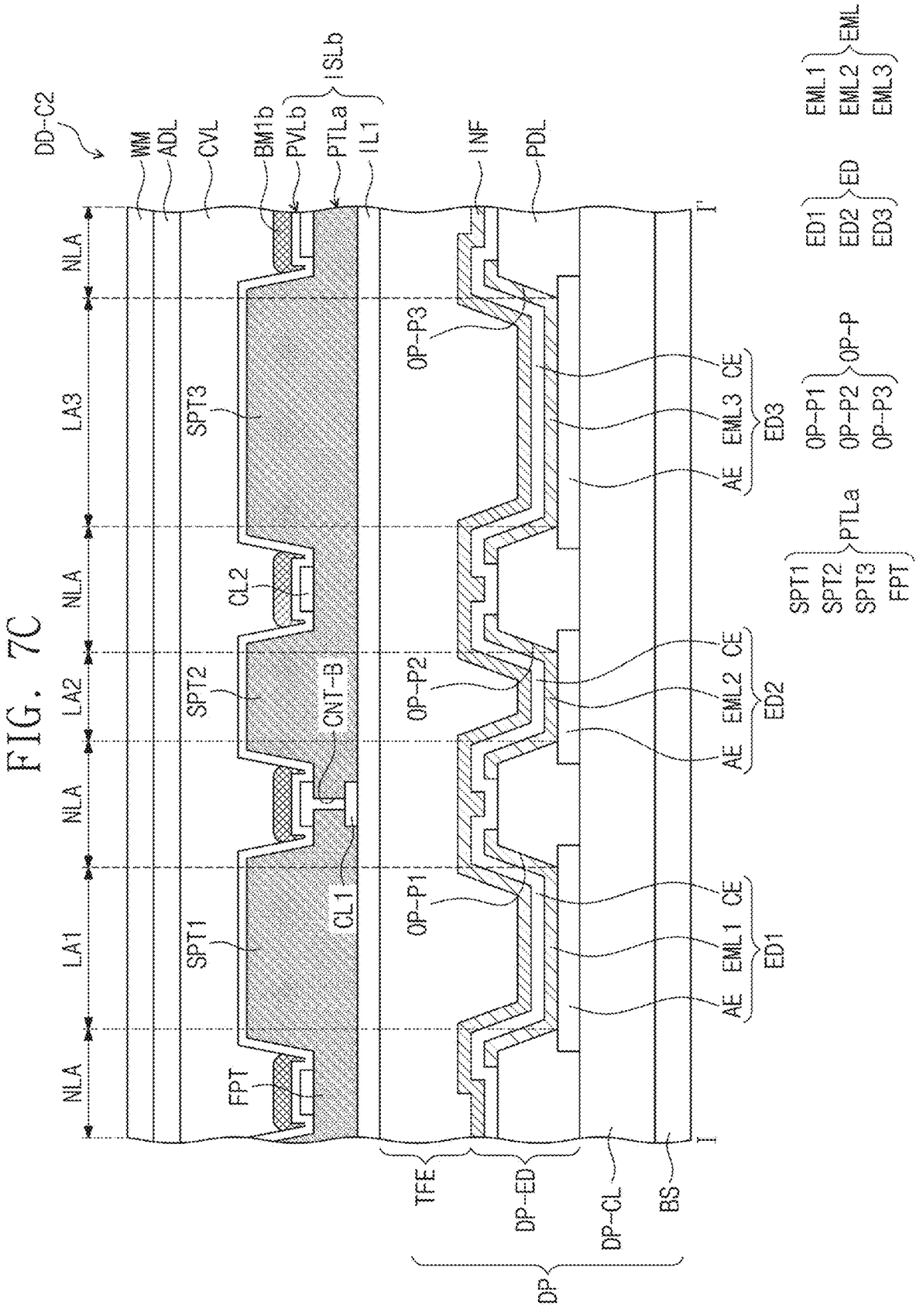
FIG. 7C is a sectional view illustrating a portion of a display device according to an embodiment of the present invention.

FIGS. 7B and 7C are sectional views, each of which illustrates a portion of a display device according to an embodiment of the present invention.

Referring to FIG. 7B, a pattern layer PTLa may include an input sensor ISLa. The pattern layer PTLa may be disposed on the first sensing insulating layer IL1. The pattern layer PTLa may cover the first conductive layer CL1, which is disposed on the first sensing insulating layer IL1. The second conductive layer CL2 may be disposed on the pattern layer PTLa.

Although not shown, the formation of the pattern layer PTLa may include patterning a high refractive material to remove portions that are not exposed to light in a lithography process. Accordingly, the pattern layer PTLa may include a first portion FPT, which has a first thickness d1, and second portions SPT1, SPT2, and SPT3, which have a second thickness d2 larger than the first thickness d1.

The first portion FPT may overlap with the non-emission region NLA in a plan view. In other words, the first portion FPT may overlap with the pixel definition layer PDL of the display panel DP in a plan view. The second portions SPT1, SPT2, and SPT3 may overlap with the first to third emission regions LA1, LA2, and LA3 in a plan view.

The second conductive layer CL2 may be electrically connected to the first conductive layer CL1 through a contact hole CNT-B, which is formed to penetrate the pattern layer PTLa. Since the second sensing insulating layer IL2 shown in FIG. 7A is replaced with the pattern layer PTLa, it may be possible to reduce a thickness of the display device DD, to simplify a fabrication process, and to reduce time and cost for the fabrication process.

The input sensor ISLa may further include a protection layer PVLa covering the second conductive layer CL2. The protection layer PVLa may be disposed to fully cover the second conductive layer CL2 and may be overlapped with a portion of the first portion FPT of the pattern layer PTLa in a plan view. Since the protection layer PVLa covers the second conductive layer CL2, the protection layer PVLa may protect the second conductive layer CL2 from potassium hydroxide (KOH) supplied from the outside.

A light-blocking pattern BM1b may be disposed between the input sensor ISLa and the low refractive layer CVL. The light-blocking pattern BM1b may be disposed on the protection layer PVLa. The protection layer PVLa may be disposed on and overlapped with the first portion FPT in a plan view, and the light-blocking pattern BM1b may be disposed on the first portion FPT and between the protection layer PVLa and the low refractive layer CVL. In an embodiment, the side surface S-B1 of the light-blocking pattern BM1b may be spaced apart from the side surface S-P of the pattern layer PTLa adjacent thereto. Here, the low refractive layer CVL may be in contact with not only the top and side surfaces U-P and S-P of the pattern layer PTLa but also the top and side surfaces U-B1 and S-B1 of the light-blocking pattern BM1b and may cover the pattern layer PTLa and the light-blocking pattern BM1b.

Referring to FIG. 7C, a protection layer PVLb may be directly disposed on the first and second portions FPT and SPT1 to SPT3 of the pattern layer PTLa and the second conductive layer CL2, when compared with the embodiment of FIG. 7B. Accordingly, since the protection layer PVLa is disposed to fully cover the pattern layer PTLa and the second conductive layer CL2 and to cover the second conductive layer CL2, the protection layer PVLa may protect the second conductive layer CL2 from potassium hydroxide (KOH) supplied from the outside.

The pattern layer PTLa having a high refractive index and the low refractive layer CVL having a low refractive index may concentrate light, which is generated in the emission device ED, and thus, the light-emitting efficiency of the display panel DP may be improved. To improve the light-emitting efficiency, the protection layer PVLb may be provided to have substantially the same refractive index as one of the low refractive layer CVL or the pattern layer PTLa, because the protection layer PVLb is disposed between the pattern layer PTLa and the low refractive layer CVL.

Figure 8A:
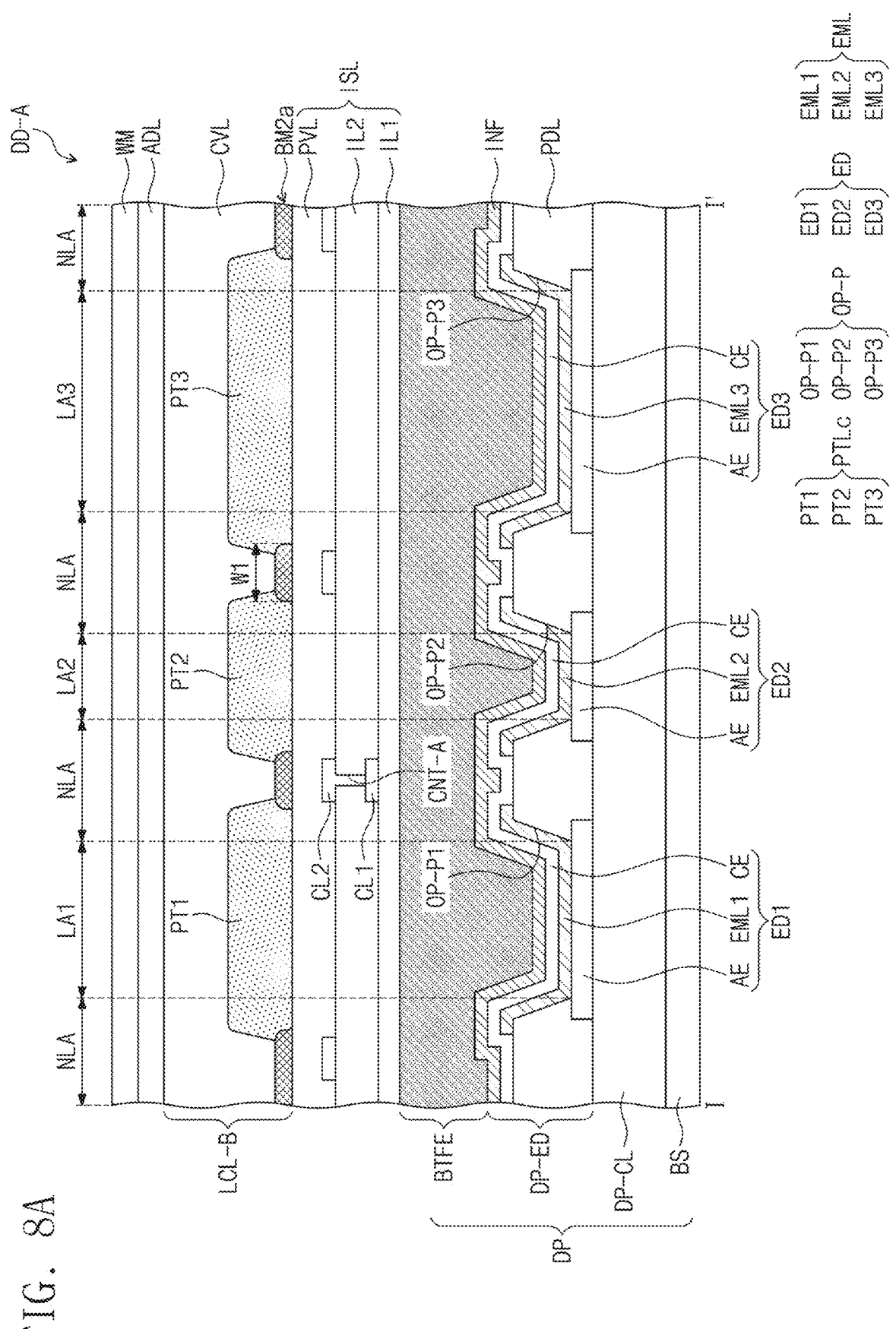
FIG. 8A is a sectional view illustrating a portion of a display device according to an embodiment of the present invention.
Figure 8B:
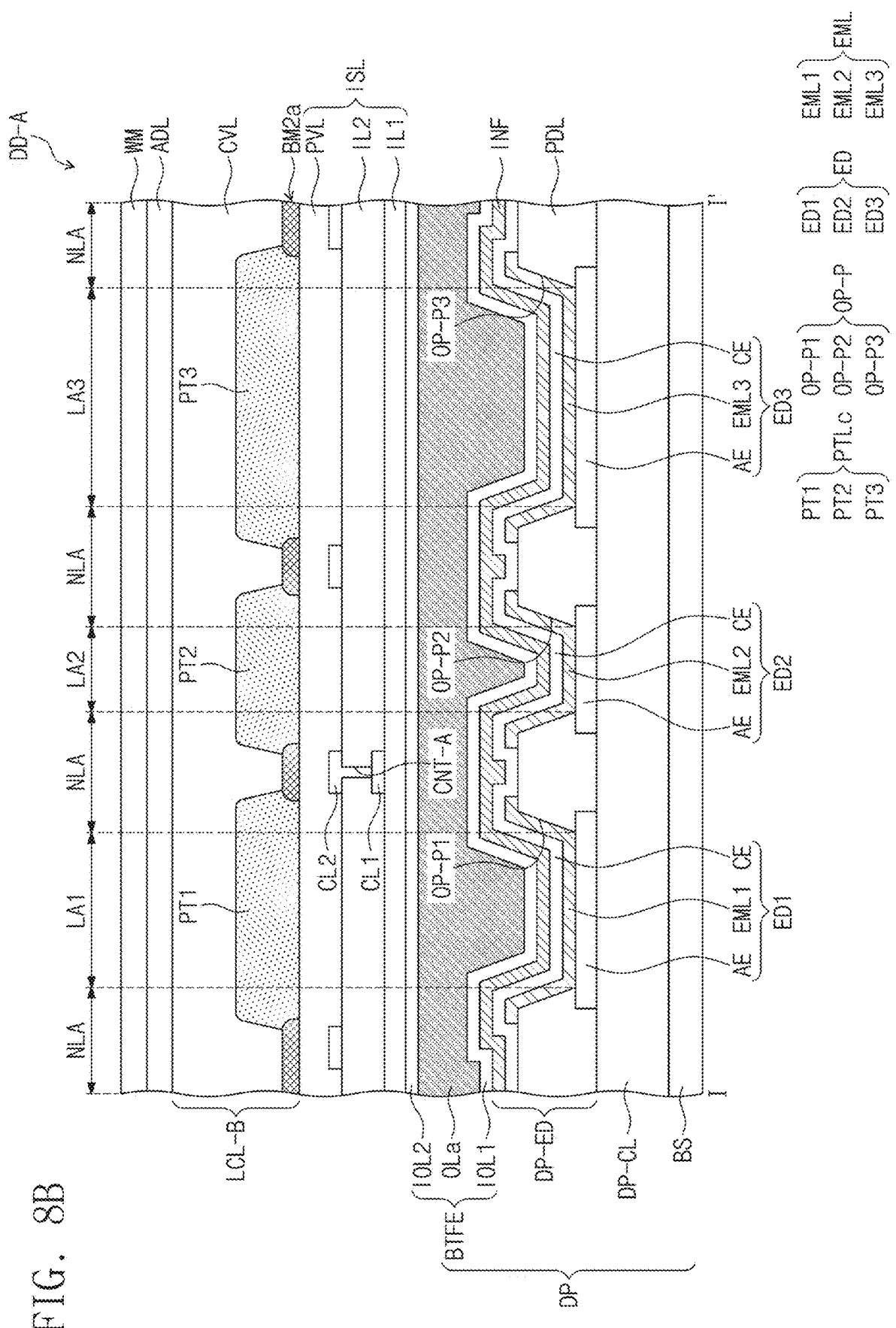
FIG. 8B is a sectional view illustrating a portion of a display device according to an embodiment of the present invention.
Figure 8C:
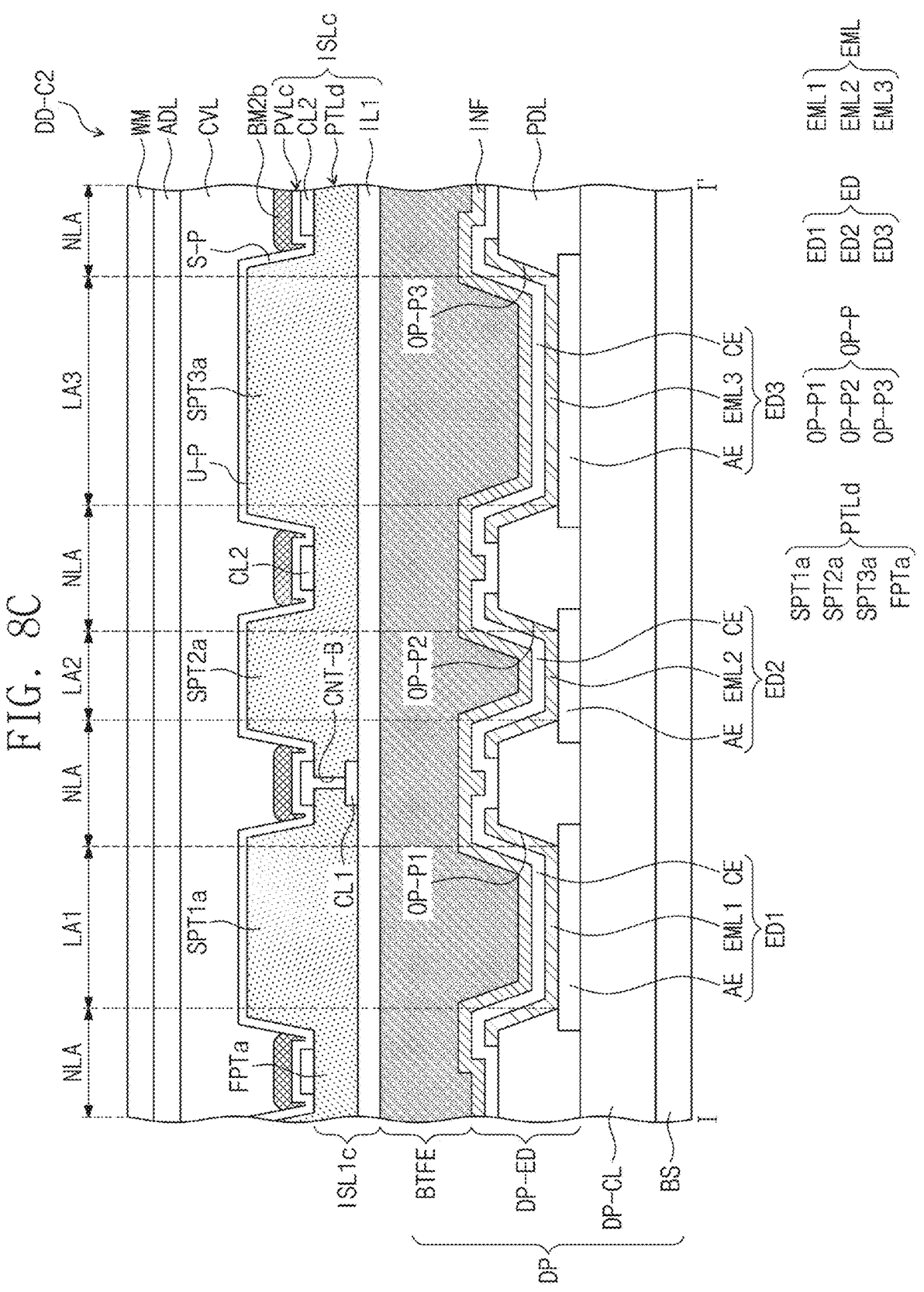
FIG. 8C is a sectional view illustrating a portion of a display device according to an embodiment of the present invention.

FIG. 8A to 8C are sectional views, each of which illustrates a portion of a display device according to an embodiment of the present invention.

Referring to FIG. 8A, a light control layer LCL-B may be disposed on the input sensor ISL. In the present embodiment, the light control layer LCL-B may include the pattern layer PTL and the low refractive layer CVL.

In an embodiment, a pattern layer PTLc may be formed of or include a polymer material. The pattern layer PTLc may be formed of or include a high refractive monomer. For example, the pattern layer PTLc may be formed of or include an acrylic resin. The pattern layer PTLc may further include a nano particle.

An encapsulation layer BTFE may be a layer, in which dye and/or pigment is dispersed. The dye and/or pigment in the encapsulation layer BTFE may be a material that is transparent to only light within a specific wavelength range.

In an embodiment, the dye and/or pigment may be chosen to have peak absorption wavelengths at each of a first wavelength range and a second wavelength range, which are different from each other. Accordingly, the dye and/or pigment may absorb light within the first and second wavelength ranges, and light, which is not within the first and second wavelength ranges, may pass through the dye and/or pigment. In an embodiment, the first wavelength range may be longer than or equal to about 490 nm and may be shorter than or equal to about 505 nm, and the second wavelength range may be longer than or equal to about 585 nm and may be shorter than or equal to about 600 nm. The dye and/or pigment may absorb about 90% of light within the first and second wavelength ranges. Due to this selective absorption and transmission by the dye and/or pigment in the encapsulation layer BTFE, it may be possible to prevent reflection of the external light and to adjust the color of light emitted from the display panel DP.

Since the encapsulation layer BTFE contains the dye and/or pigment, the encapsulation layer BTFE may absorb light of a specific wavelength and may be substantially transparent to light within the remaining wavelength range. That is, owing to the encapsulation layer BTFE, only the light within the specific wavelength range, among the external light, may be incident into the input sensor ISL and the display panel DP.

Thus, it may be unnecessary to add a reflection adjusting layer (e.g., a polarization film, a color filter layer, or a light absorption layer including dye and/or pigment), which is desirable to adjust the reflectance of the external light, in the display device DD, and as a result, it may be possible to reduce a thickness of the display device DD, to omit a mask for forming the reflection adjusting layer, and to simplify the fabrication process.

Referring to FIG. 8B, the encapsulation layer BTFE may include the first inorganic layer IOL1, the second inorganic layer IOL2, and an organic layer OLa. The first inorganic layer IOL1 may be directly disposed on the anti-reflection layer INF. The organic layer Ola may be disposed between the first and second inorganic layers IOL1 and IOL2, and the second inorganic layer IOL2 may cover the organic layer OLa.

The organic layer Ola may be a layer, in which dye and/or pigment is dispersed. For example, the dye and/or pigment may be an organic compound, such as alizarin, indigo dye, and Tyrian purple. However, the present invention is not limited to this example, the dye and/or pigment may be at least one of metal- and mineral-based inorganic compounds or carbon-based materials in another embodiment. The dye and/or pigment in the organic layer OLa may be a material that is transparent to only light within a specific wavelength range. The first inorganic layer IOL1 and the second inorganic layer IOL2 may protect the display device layer DP-ED from moisture and/or oxygen, and the organic layer OL may protect the display device layer DP-ED from a contamination material (e.g., a dust particle). In an embodiment, the second inorganic layer IOL2 may be omitted.

Referring to FIG. 8C, a pattern layer PTLd may include an input sensor ISLc. In particular, the pattern layer PTLd may be disposed on the first sensing insulating layer IL1. The pattern layer PTLd may cover the first conductive layer CL1 disposed on the first sensing insulating layer IL1. The second conductive layer CL2 may be disposed on the pattern layer PTLd. The second conductive layer CL2 may be covered with a protection layer PVLc. A light-blocking pattern BM2b may be disposed between the protection layer PVLc and the low refractive layer CVL.

In the present embodiment, since the second sensing insulating layer IL2 shown in FIG. 8B is replaced with the pattern layer PTLd, it may be possible to reduce a thickness of the display device DD, to simplify a fabrication process, and to reduce time and cost for the fabrication process.

Referring to FIG. 8C, the pattern layer PTLd may not contain the dye and/or pigment, when compared with the pattern layer PTLa shown in FIG. 7C, but it may have the same structure as the pattern layer PTLa shown in FIG. 7C. Thus, a detailed description of the pattern layer PTLd will be omitted.

Figure 9A:
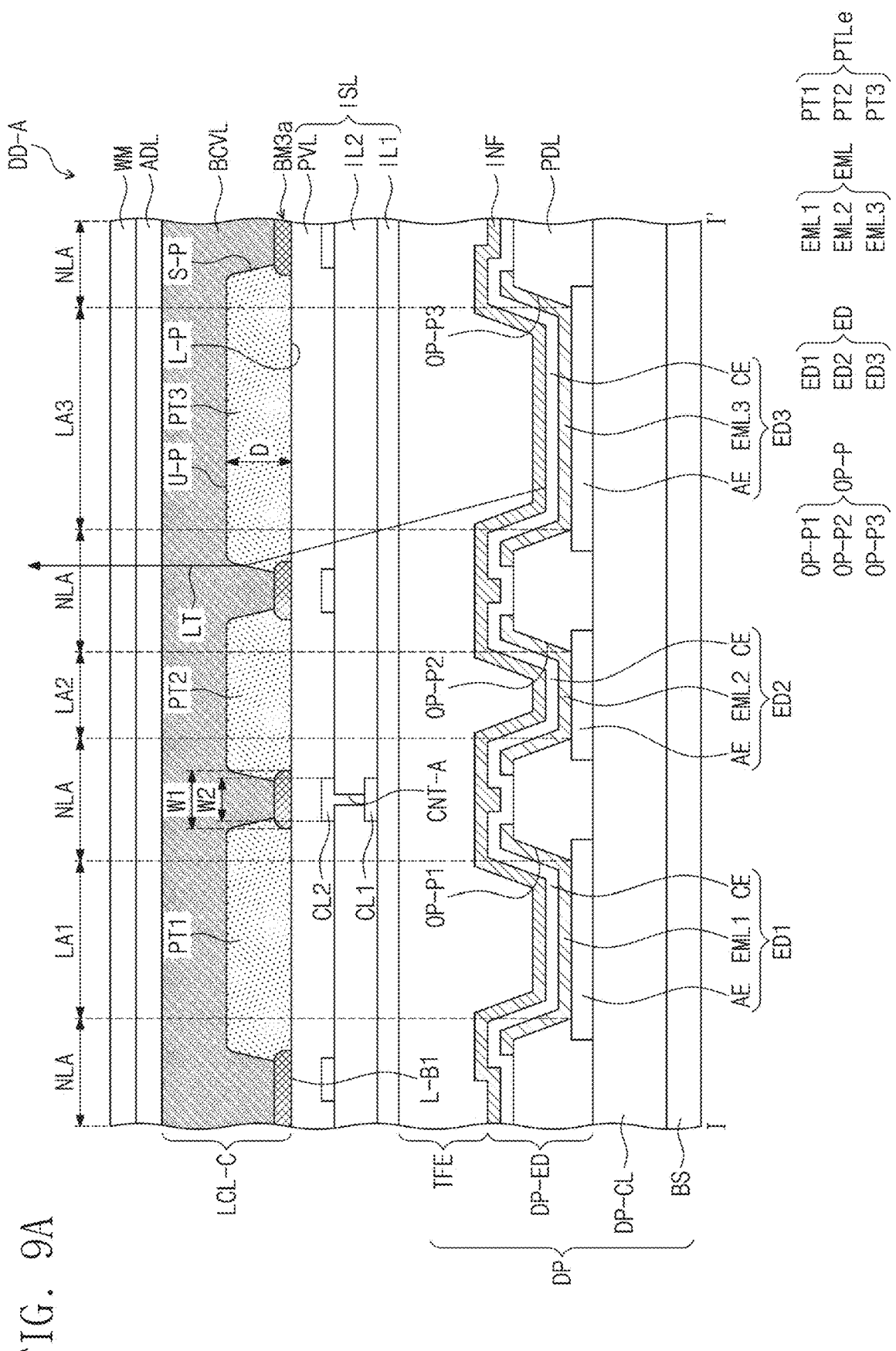
FIG. 9A is a sectional view illustrating a portion of a display device according to an embodiment of the present invention.
Figure 9B:
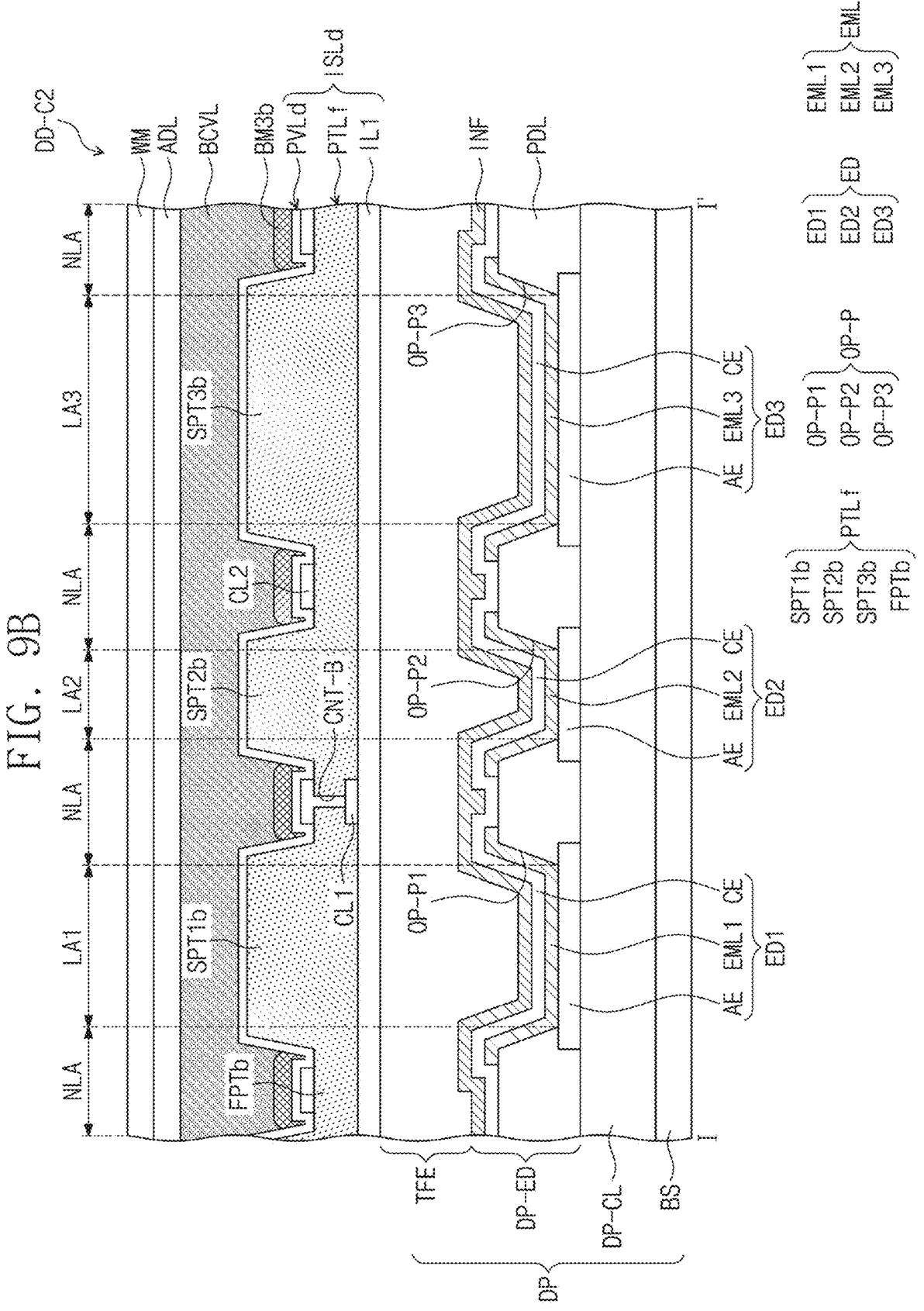
FIG. 9B is a sectional view illustrating a portion of a display device according to an embodiment of the present invention.

FIGS. 9A and 9B are sectional views, each of which illustrates a portion of a display device according to an embodiment of the present invention.

A light control layer LCL-C may be disposed on the input sensor ISL. In the present embodiment, the light control layer LCL-B may include a pattern layer PTLe and a low refractive layer BCVL.

In an embodiment, the pattern layer PTLe may be formed of or include a polymer material. The pattern layer PTLe may be formed of or include a high refractive monomer. For example, the pattern layer PTLe may be formed of or include an acrylic resin. The pattern layer PTLe may further include a nano particle.

Referring to FIG. 9A, the low refractive layer BCVL may be a layer, in which dye and/or pigment is dispersed. The dye and/or pigment the low refractive layer BCVL may be a material that is transparent to only light within a specific wavelength range.

In an embodiment, the dye and/or pigment may be chosen to have peak absorption wavelengths at each of a first wavelength range and a second wavelength range, which are different from each other. Accordingly, the dye and/or pigment may absorb light within the first and second wavelength ranges, and light, which is not within the first and second wavelength ranges, may pass through the dye and/or pigment. In an embodiment, the first wavelength range may be longer than or equal to about 490 nm and may be shorter than or equal to about 505 nm, and the second wavelength range may be longer than or equal to about 585 nm and may be shorter than or equal to about 600 nm. The dye and/or pigment may absorb about 90% of light within the first and second wavelength ranges. Due to this selective absorption and transmission by the dye and/or pigment in the low refractive layer BCVL, it may be possible to prevent reflection of the external light and to adjust the color of light emitted from the display panel DP.

Since the low refractive layer BCVL contains the dye and/or pigment, the low refractive layer BCVL may absorb light of a specific wavelength and may be substantially transparent to light within the remaining wavelength range. That is, owing to the low refractive layer BCVL, only the light within the specific wavelength range, among the external light, may be incident into the input sensor ISL and the display panel DP.

Thus, it may be unnecessary to add a reflection adjusting layer (e.g., a polarization film, a color filter layer, or a light absorption layer including dye and/or pigment), which is desirable to adjust the reflectance of the external light, in the display device DD, and as a result, it may be possible to reduce a thickness of the display device DD, to omit a mask for forming the reflection adjusting layer, and to simplify the fabrication process.

Referring to FIG. 9B, a pattern layer PTLf may include an input sensor ISLd. The pattern layer PTLf may be disposed on the first sensing insulating layer ILL The pattern layer PTLf may cover the first conductive layer CL1 disposed on the first sensing insulating layer IL1. The second conductive layer CL2 may be disposed on the pattern layer PTLf Since the second sensing insulating layer IL2 shown in FIG. 9A is replaced with the pattern layer PTLf, it may be possible to reduce a thickness of the display device DD, to simplify a fabrication process, and to reduce time and cost for the fabrication process.

Referring to FIG. 9B, the pattern layer PTLf may not contain the dye and/or pigment, when compared with the pattern layer PTLa shown in FIG. 7C, but it may have the same structure as the pattern layer PTLa shown in FIG. 7C. Thus, a detailed description of the pattern layer PTLf will be omitted.

FIGS. 10A to 10H are sectional views illustrating a method of fabricating a display device, according to an embodiment of the present invention. In a fabrication method to be described with reference to FIGS. 10A to 10H, an element previously described with reference to FIGS. 1 to 9B may be identified by the same reference number without repeating an overlapping description thereof.

Figure 10A:
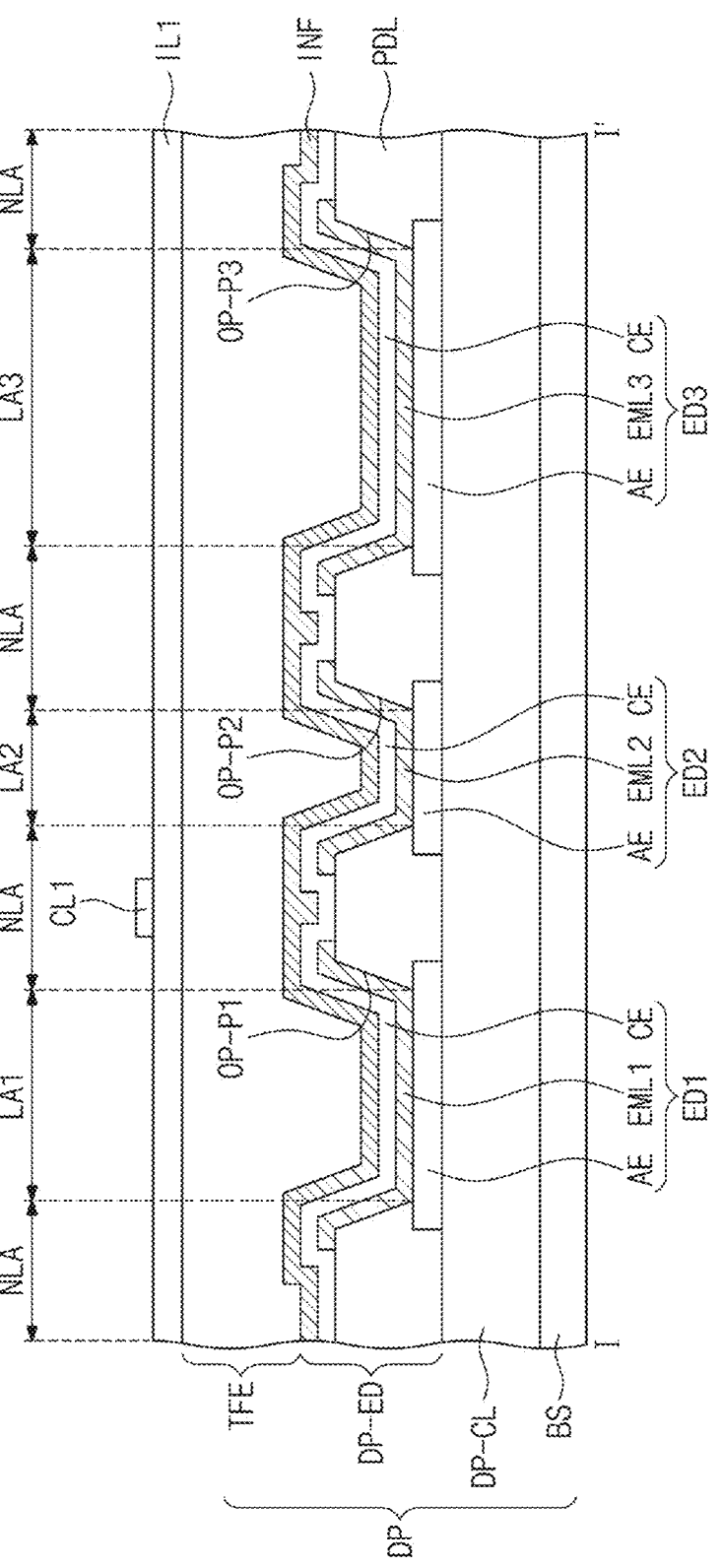

Referring to FIG. 10A, a method of fabricating the display device DD (e.g., see FIG. 1) may include a step of forming the first sensing insulating layer IL1 and the first conductive layer CL1 on the display panel DP.

Although not shown, the first conductive layer CL1 may be formed by forming the first sensing insulating layer IL1 on the display panel DP, forming a conductive layer to cover a top surface of the first sensing insulating layer IL', and patterning the conductive layer.

Figure 10B:
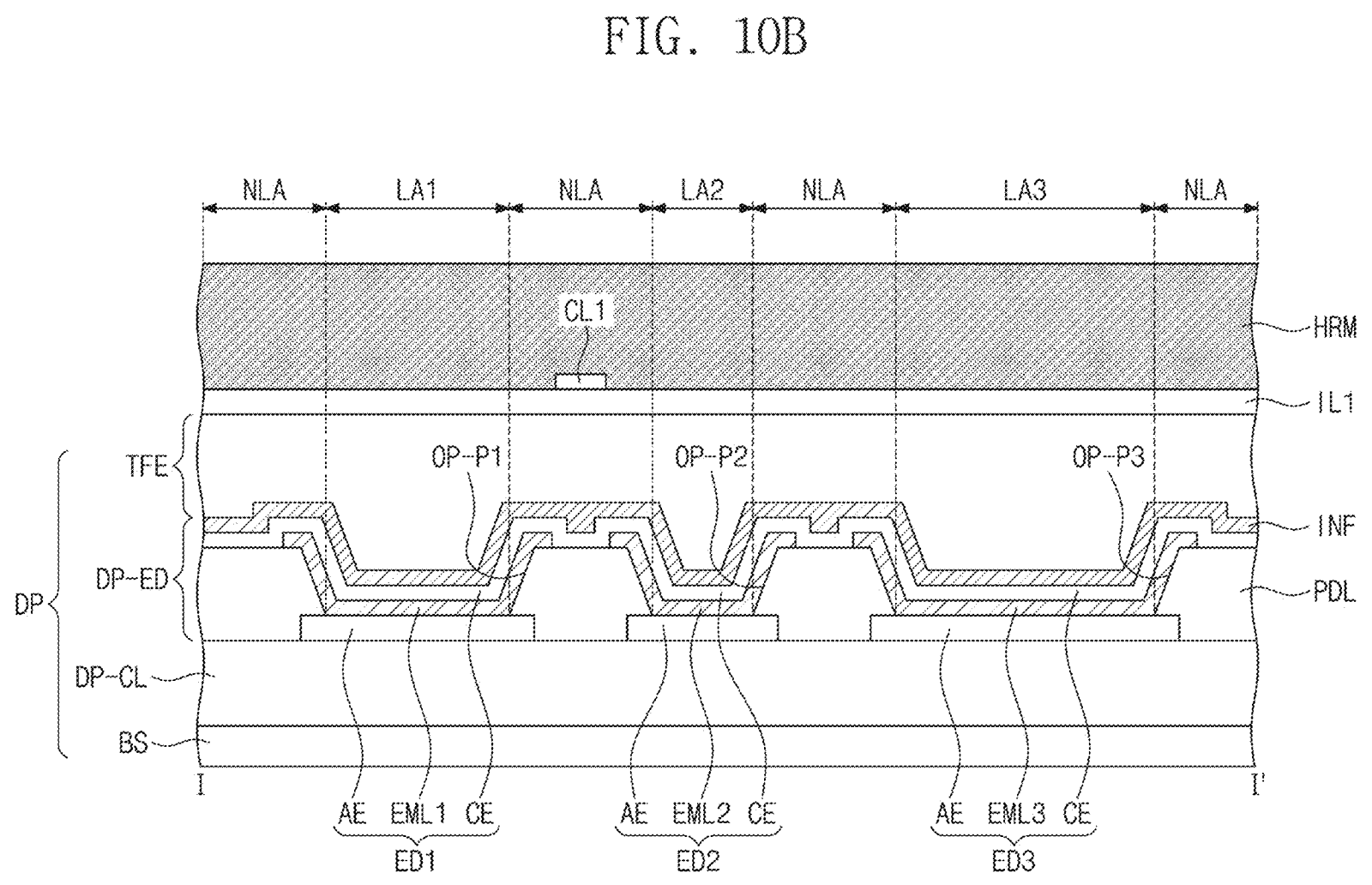

Thereafter, referring to FIG. 10B, a step of forming the pattern layer PTLa (e.g., see FIG. 10C) on the display panel DP may include a step of coating a high refractive material HRM on the display panel DP. In the present embodiment, the high refractive material HRM may be formed of or include a polymer material. The high refractive material HRM may be formed a high refractive monomer. The high refractive material HRM may cover the display panel DP and the first conductive layer CL1.

Next, the step of forming the pattern layer PTLa (e.g., see FIG. 10C) on the display panel DP may further include a step of patterning the high refractive material HRM. The step of patterning the high refractive material HRM may include steps of disposing a halftone mask on the high refractive material HRM and irradiating the high refractive material HRM with light or exposing the high refractive material HRM to the light. Here, the halftone mask may include a first masking region having a first optical transmittance and a second masking region having a second optical transmittance. The first masking region may correspond to the emission regions LA1 to LA3, and the second masking region may correspond to the non-emission region NLA. The first optical transmittance may be lower than the second optical transmittance. The second masking region may include a contact region having a third optical transmittance. The second optical transmittance may be lower than the third optical transmittance.

In the case where the high refractive material HRM has a property of a negative resist, a portion of the high refractive material HRM, which is exposed to light, may be hardened, and an unexposed portion may be removed during a developing process. Since the first and second masking regions have optical transmittances different from each other, the removal property in a region of the high refractive material HRM corresponding to the first masking region may be different from the removal property in a region of the high refractive material HRM corresponding to the second masking region. Even within the second masking region, the removal property in a region of the high refractive material HRM corresponding to the contact region of the third optical transmittance may be different from the removal property in a region of the high refractive material HRM corresponding to the remaining portion of the second masking region excluding the contact region.

Figure 10C:
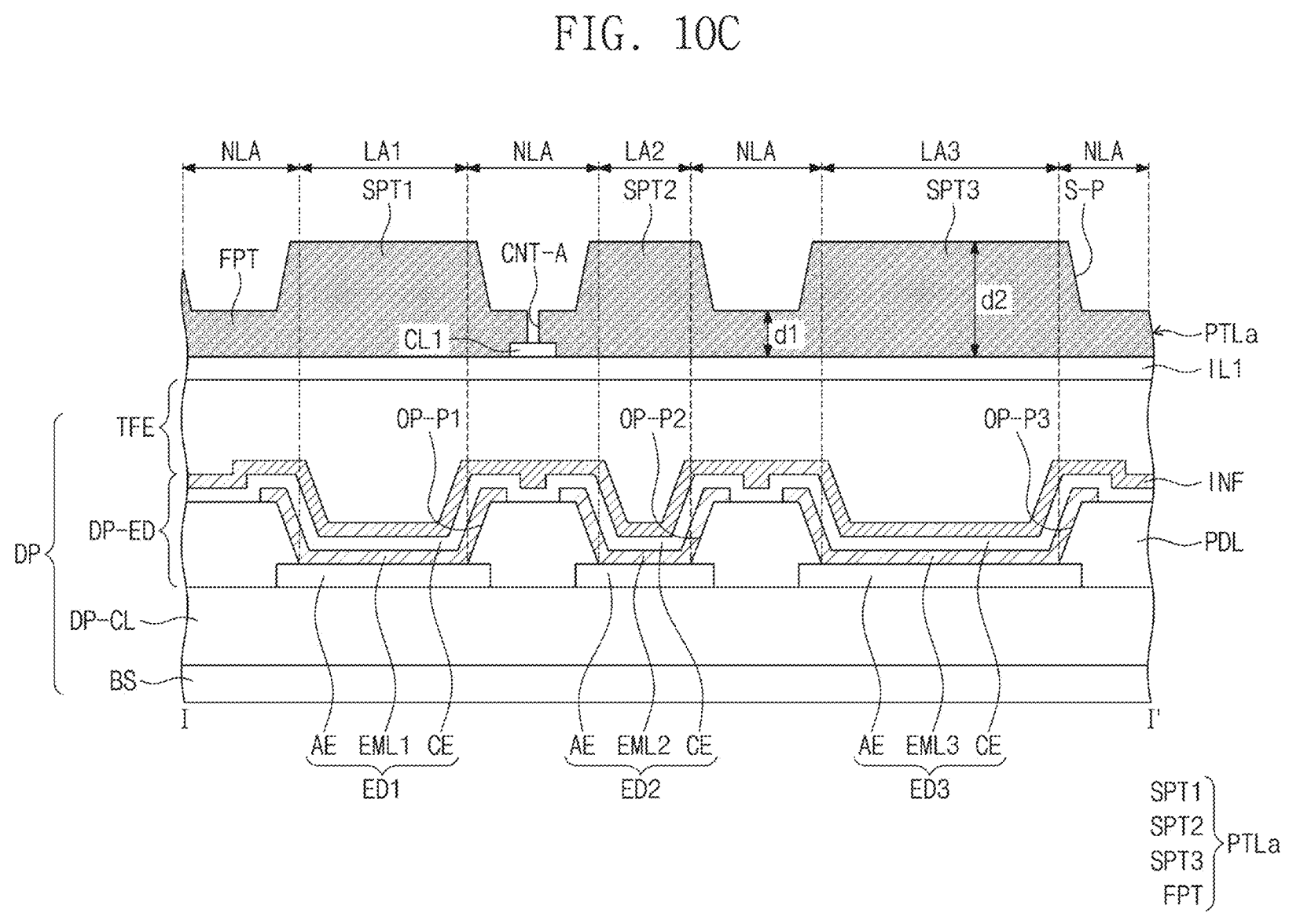

Thereafter, referring to FIG. 10C, a developing process may be performed to remove the unexposed portions of the high refractive material HRM (e.g., see FIG. 10B), and as a result, the pattern layer PTLa may be formed.

In an embodiment, developing solution, which is used in the developing process on the high refractive material HRM, may contain tetramethylammonium hydroxide ("TMAH"). Since the TMAH solution has low reactivity to a metallic material (especially, aluminum (Al)), the use of the TMAH solution may prevent interconnection lines, which are disposed in the input sensor ISL, from being damaged in the developing process on the high refractive material HRM.

As a result of the patterning process, the pattern layer PTLa may include the first portion FPT, which has a first thickness d1, and the second portions SPT1, SPT2, and SPT3, which have a second thickness d2 larger than the first thickness d1. The first portion FPT may overlap with the non-emission region NLA in a plan view. In other words, the first portion FPT may overlap with the pixel definition layer PDL of the display panel DP in a plan view. The second portions SPT1, SPT2, and SPT3 may overlap with first to third emission regions LA1-LA3 in a plan view.

Next, although not shown, the fabricating method may include a step of performing a plasma treatment and an extreme ultraviolet ("EUV") treatment on the pattern layer PTLa. Hardness of the polymer material in the pattern layer PTLa may be increased by the treatment step, and thus, the pattern layer PTLa may be formed to have hardness higher than hardness of the high refractive material HRM.

In an embodiment, the plasma treatment step or the EUV treatment step may be omitted.

Figure 10D:
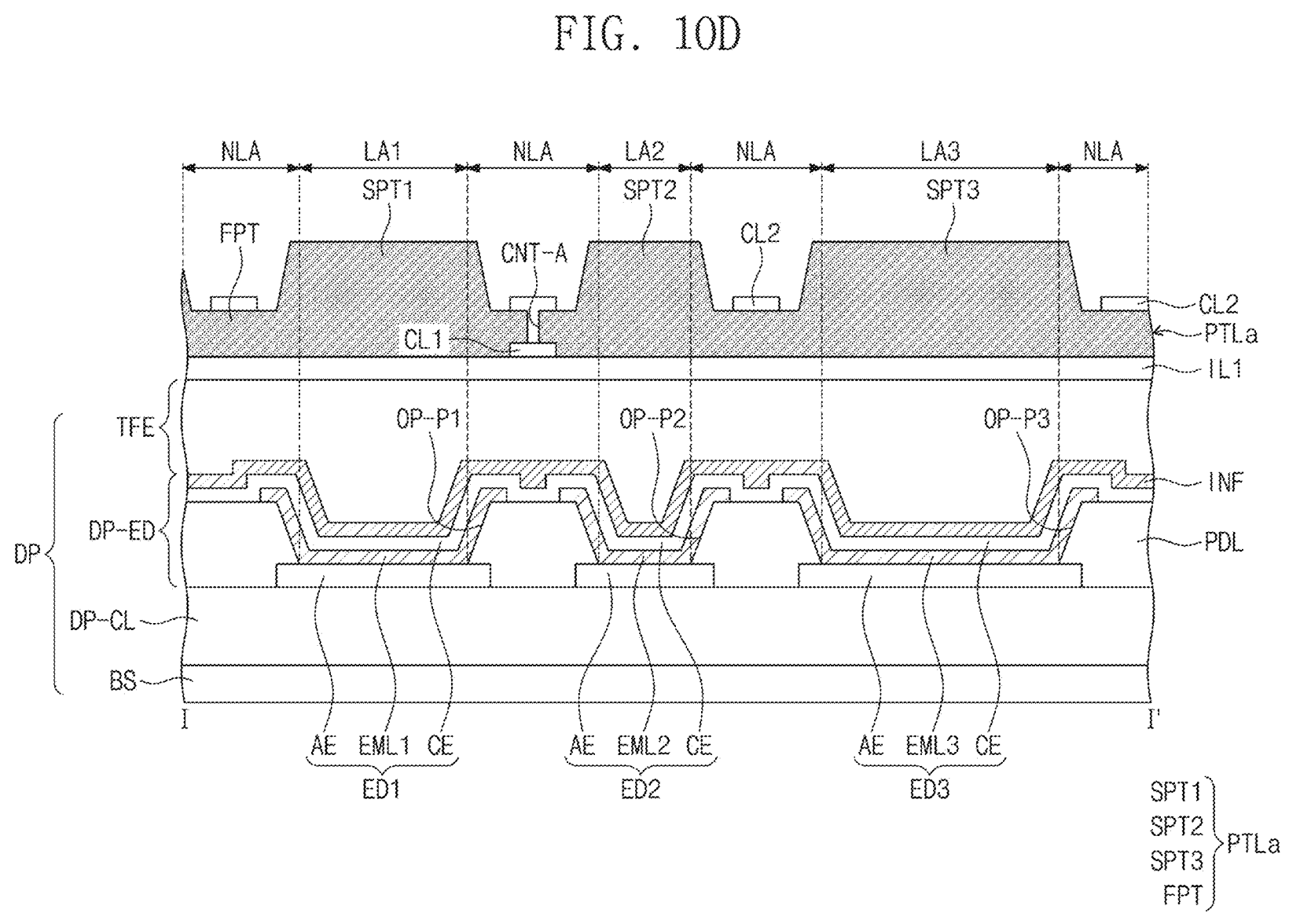

Thereafter, referring to FIG. 10D, the contact hole CNT-A may be formed in the first portion FPT of the pattern layer PTLa. The contact hole CNT-A may be formed by removing a portion of the first portion FPT overlapped with the first conductive layer CL1 in a plan view.

Next, the second conductive layer CL2 may be formed on the first portion FPT with the contact hole CNT-A. Although not shown, the second conductive layer CL2 may be formed by forming a conductive material on a top surface of the pattern layer PTL and patterning the conductive layer.

The second conductive layer CL2 may be extended through the contact hole CNT-A, which is formed in the first portion FPT at a region overlapped with the first conductive layer CL1, to be in contact with the first conductive layer CL1 in a plan view.

Figure 10E:
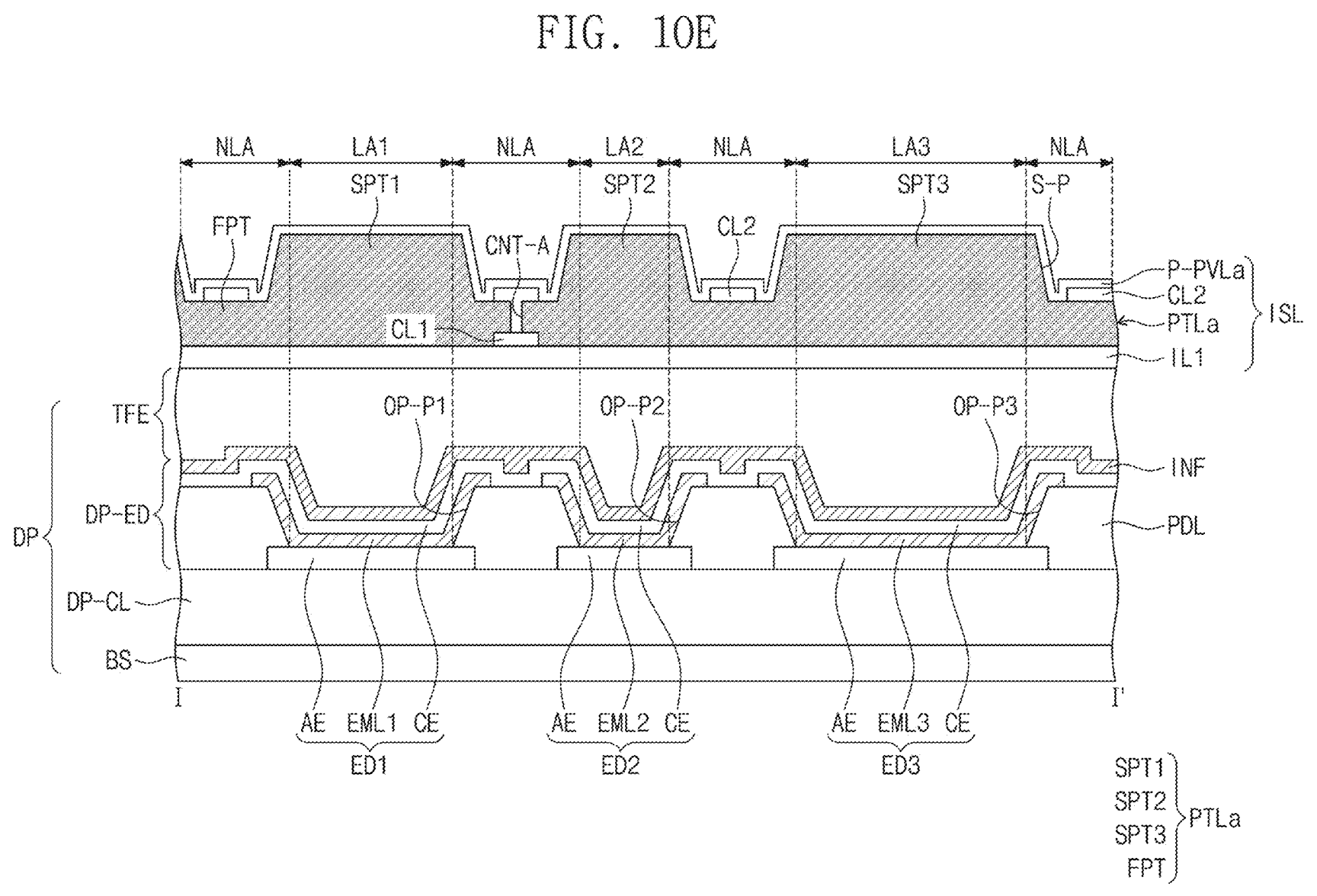
Figure 10F:
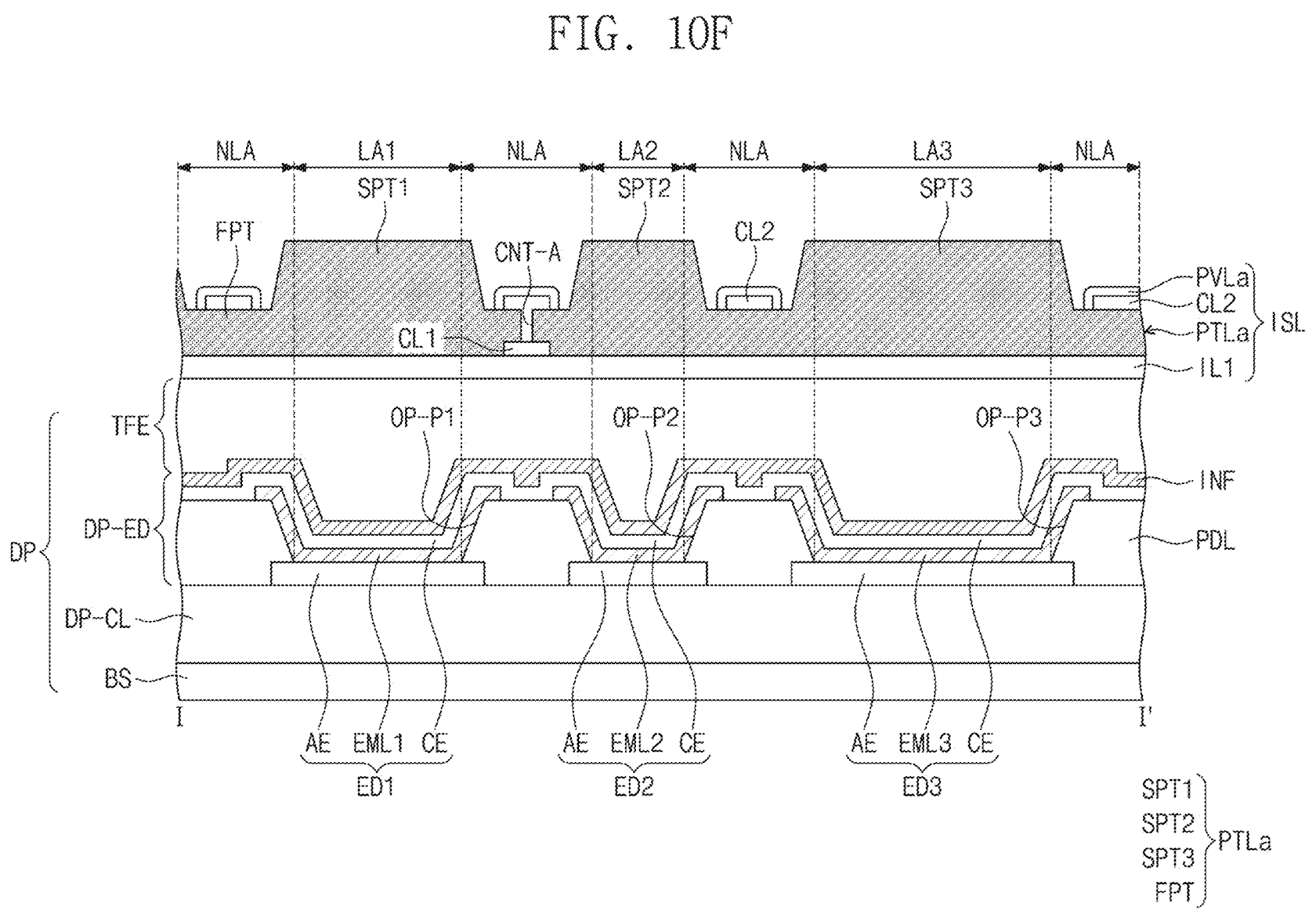

Thereafter, referring to FIGS. 10E and 10F, a preliminary protection layer P-PVLa may be directly formed on the pattern layer PTLa and the second conductive layer CL2. Next, the preliminary protection layer P-PVLa, which is formed on the pattern layer PTLa, may be patterned to form the protection layer PVLa corresponding to the first portion FPT (or the second conductive layer CL2). Since the protection layer PVLa is formed to cover the second conductive layer CL2, the second conductive layer CL2 may be protected from a developing solution KOH used in a process of developing the low refractive layer CVL (e.g., see FIG. 10H).

Figure 10G:
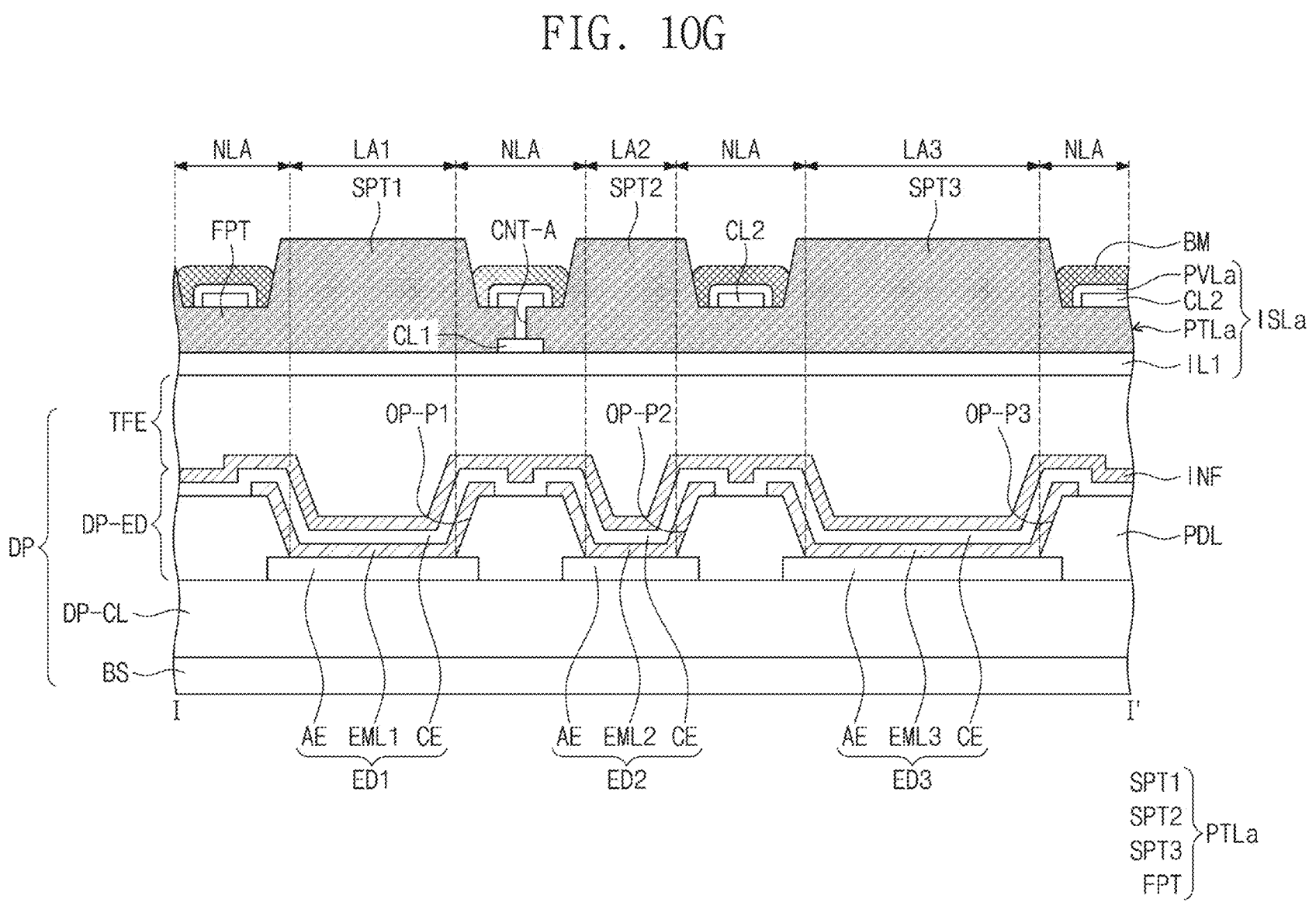

Referring to FIG. 10G, the fabricating method may include a step of forming the light-blocking pattern BM.

The step of forming the light-blocking pattern BM may include steps of coating a light-blocking material on the display panel DP to cover the pattern layer PTL, placing a mask on the coated light-blocking material, irradiating the coated light-blocking material with light, and developing the irradiated light-blocking material to form the light-blocking pattern BM.

In the present embodiment, the light-blocking pattern BM may overlap with the non-emission region NLA in a plan view. In other words, the light-blocking pattern BM may overlap with the pixel definition layer PDL of the display panel DP in a plan view. In addition, the light-blocking pattern BM may be formed to enclose the protection layer PVLa in a plan view.

Figure 10H:
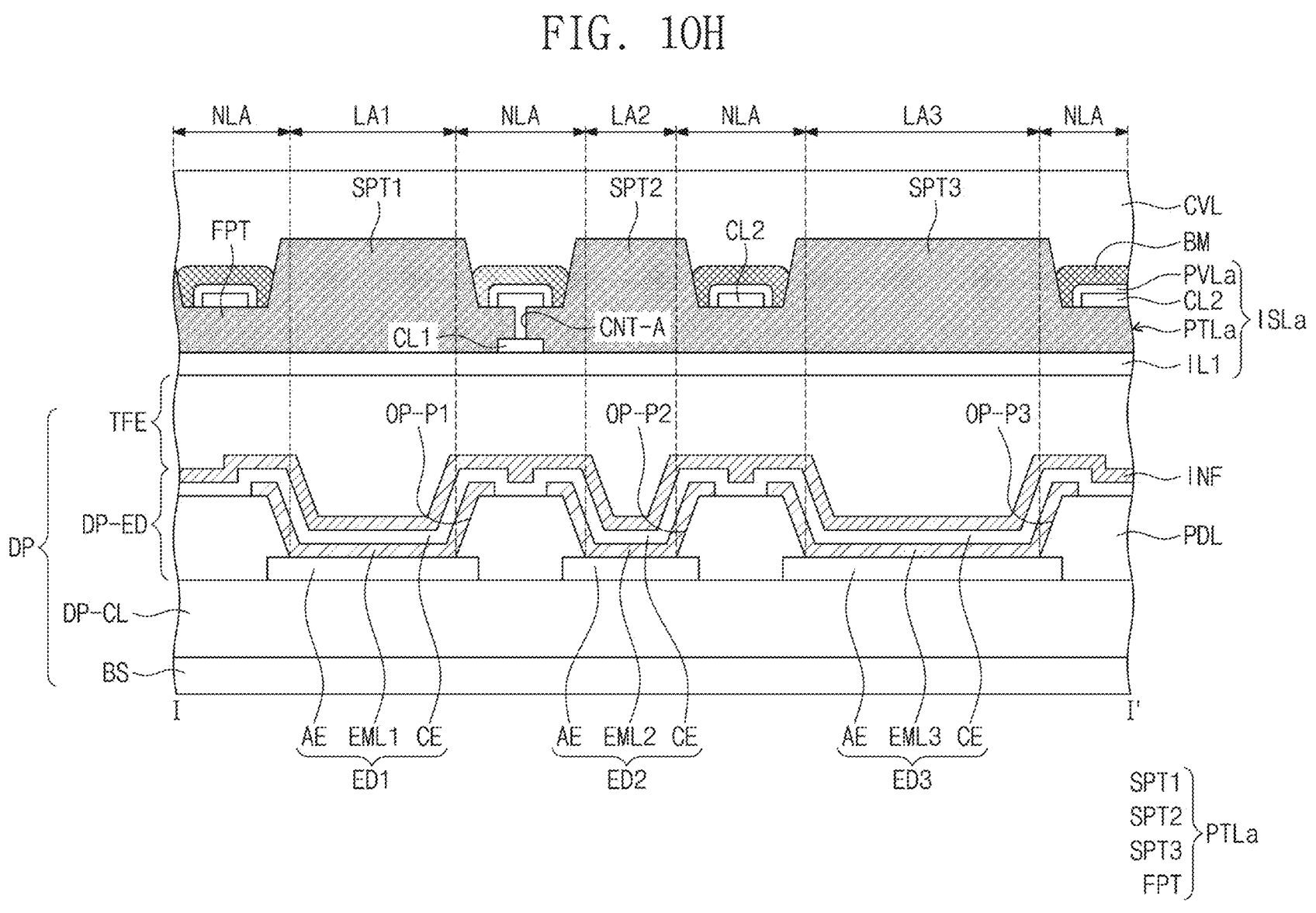

Referring to FIG. 10H, the fabricating method may include forming the low refractive layer CVL. The low refractive layer CVL may be formed to cover the pattern layer PTLa. In other words, the low refractive layer CVL may be directly disposed on the pattern layer PTLa.

The low refractive layer CVL may be formed in units of cells on the basis of one display device DD (refer to FIG. 1) through a photolithography process, and the low refractive layer CVL may be provided by an inkjet printing method.

In the case where the low refractive layer CVL is formed by a photolithography process, developing solution, which is used in a developing process on the low refractive layer CVL, may contain potassium hydroxide (KOH). Since the KOH solution has low reactivity to a metallic material (especially, aluminum (Al)), the use of the KOH solution may prevent interconnection lines, which are disposed in the input sensor ISL, from being damaged in the developing process on the low refractive layer CVL.

In a display device according to an embodiment of the present invention, at least one of the pattern layer, the encapsulation layer, and the low refractive layer, may include at least one of pigment or dye, and thus, it may be possible to reduce reflectance of external light. Accordingly, it is unnecessary to additionally form a reflection adjusting layer for reducing the reflectance of the external light in the display device, and thus, it may be possible to reduce a total thickness of the display device and to simplify a process of fabricating the display device.

While example embodiments of the present invention have been particularly shown and described, it will be understood by one of ordinary skill in the art that variations in form and detail may be made therein without departing from the spirit and scope of the attached claims.

What is claimed is:

1. A display device, comprising:
a display panel; and
a pattern layer disposed on the display panel; and
a low refractive layer covering the pattern layer and having a refractive index lower than a refractive index of the pattern layer,
wherein the display panel comprises:

a base layer;
a pixel definition layer disposed on the base layer, wherein a pixel opening is defined in the pixel definition layer;
an emission device including an emission layer disposed in the pixel opening;
an anti-reflection layer disposed on the emission device; and
an encapsulation layer disposed on the anti-reflection layer,
wherein at least one of the pattern layer, the encapsulation layer, and the low refractive layer comprises at least one of pigment or dye.

2. The display device of claim 1, wherein the pattern layer is overlapped with the pixel opening in a plan view.

3. The display device of claim 2, wherein the pattern layer comprises at least one of pigment or dye.

4. The display device of claim 3, further comprising an input sensor disposed between the display panel and the pattern layer.

5. The display device of claim 4, further comprising a light-blocking pattern disposed on the input sensor,
wherein the light-blocking pattern is not overlapped with the pixel opening in the plan view.

6. The display device of claim 3, further comprising an input sensor disposed on the display panel,
wherein the input sensor comprises:
a first conductive layer;
a second conductive layer; and
the pattern layer, a portion of which is disposed between the first conductive layer and second conductive layer.

7. The display device of claim 6, wherein the pattern layer comprises a first portion having a first thickness and a second portion having a second thickness larger than the first thickness.

8. The display device of claim 7, further comprising a light-blocking pattern, which is disposed between the first portion of the pattern layer and the low refractive layer.

9. The display device of claim 7, wherein the input sensor further comprises a protection layer covering at least the first portion of the pattern layer.

10. The display device of claim 9, wherein the protection layer covers the first and second portions of the pattern layer, and a refractive index of the protection layer is equal to the refractive index of one of the pattern layer or the low refractive layer.

11. The display device of claim 2, wherein the encapsulation layer comprises at least one of pigment or dye.

12. The display device of claim 11, further comprising a light-blocking pattern disposed on the display panel,
wherein the light-blocking pattern is not overlapped with the pixel opening in the plan view.

13. The display device of claim 12, wherein the pattern layer comprises a first portion having a first thickness and a second portion having a second thickness larger than the first thickness, and
the light-blocking pattern is disposed between the first portion of the pattern layer and the low refractive layer.

14. The display device of claim 13, further comprising a protection layer covering at least the first portion of the pattern layer,
wherein a refractive index of the protection layer is equal to the refractive index of one of the pattern layer or the low refractive layer.

15. The display device of claim 11, further comprising an input sensor disposed on the display panel,
wherein the input sensor comprises:
a first conductive layer;

a second conductive layer; and the pattern layer, a portion of which is disposed between the first conductive layer and second conductive layer.

16. The display device of claim 2, wherein the low refractive layer comprises at least one of pigment or dye.

17. The display device of claim 16, further comprising an input sensor disposed on the display panel, wherein the input sensor comprises:

a first conductive layer;

a second conductive layer; and the pattern layer, a portion of which is disposed between the first conductive layer and second conductive layer.

18. The display device of claim 17, wherein the pattern layer comprises a first portion having a first thickness and a second portion having a second thickness larger than the first thickness, the display device further comprises:

a light-blocking pattern disposed between the first portion of the pattern layer and the low refractive layer, and a protection layer covering the first and second portions of the pattern layer, and a refractive index of the protection layer is equal to the refractive index of one of the pattern layer or the low refractive layer.

19. The display device of claim 1, wherein the pigment or dye, which is included in at least one of the pattern layer, the encapsulation layer, and the low refractive layer, has a peak absorption wavelength at each of a first wavelength range and a second wavelength range different from the first wavelength range.

20. The display device of claim 1, wherein the anti-reflection layer comprises at least one selected from the group consisting of bismuth (Bi) and ytterbium (Yb).

21. An electronic device comprising:

a display panel; and a pattern layer disposed on the display panel; and a low refractive layer covering the pattern layer and having a refractive index lower than a refractive index of the pattern layer, wherein the display panel comprises:

a base layer;

a pixel definition layer disposed on the base layer, wherein a pixel opening is defined in the pixel definition layer;

an emission device including an emission layer disposed in the pixel opening;

an anti-reflection layer disposed on the emission device; and an encapsulation layer disposed on the anti-reflection layer, wherein at least one of the pattern layer, the encapsulation layer, and the low refractive layer comprises at least one of pigment or dye.

\* \* \* \* \*